(12) United States Patent
Mishra et al.

(10) Patent No.: US 12,513,984 B2
(45) Date of Patent: Dec. 30, 2025

(54) DOUBLE-SIDED INTEGRATED CIRCUIT TRANSISTOR STRUCTURES WITH DEPOPULATED BOTTOM CHANNEL REGIONS

(71) Applicant: Intel Corporation, Santa Clara, CA (US)

(72) Inventors: Varun Mishra, Hillsboro, OR (US); Peng Zheng, Portland, OR (US); Aaron Lilak, Beaverton, OR (US); Tahir Ghani, Portland, OR (US); Harold Kennel, Portland, OR (US); Mauro Kobrinsky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 979 days.

(21) Appl. No.: 16/905,743

(22) Filed: Jun. 18, 2020

(65) Prior Publication Data

US 2021/0398977 A1    Dec. 23, 2021

(51) Int. Cl.
  *H10D 84/85*   (2025.01)
  *H10B 10/00*   (2023.01)
  (Continued)

(52) U.S. Cl.
  CPC .......... *H10D 84/853* (2025.01); *H10B 10/12* (2023.02); *H10D 30/62* (2025.01); *H10D 62/371* (2025.01);
  (Continued)

(58) Field of Classification Search
  CPC ......... H01L 29/66787; H01L 29/78696; H01L 29/0673; H01L 29/42392; H01L 27/0688; H01L 27/0694
  See application file for complete search history.

(56) References Cited

U.S. PATENT DOCUMENTS

| | | | |
|---|---|---|---|
| 9,437,501 | B1 | 9/2016 | Cheng et al. |
| 10,170,484 | B1 * | 1/2019 | Sung ................. H01L 29/66439 |

(Continued)

FOREIGN PATENT DOCUMENTS

| | | |
|---|---|---|
| EP | 3581543 | 12/2019 |
| EP | 3644375 | 4/2020 |
| EP | 3678170 | 7/2020 |

OTHER PUBLICATIONS

Huang, Ya-Chi, et al., "An Area Efficient Low-Voltage 6-T SRAM Cell Using Stacked Silicon Nanowires", ICICDT 2018, Otranto, Italy, Session F—Advanced Memory Devices, 4 pgs.

(Continued)

*Primary Examiner* — Jessica S Manno
*Assistant Examiner* — Ricky Verdes
(74) *Attorney, Agent, or Firm* — Essential Patents Group, LLP

(57) ABSTRACT

Integrated circuitry comprising interconnect metallization on both front and back sides of a gate-all-around (GAA) transistor structure lacking at least one active bottom channel region. Bottom channel regions may be depopulated from a GAA transistor structure following removal of a back side substrate that exposes an inactive portion of a semiconductor fin. During back-side processing, one or more bottom channel region may be removed or rendered inactive through dopant implantation. Back-side processing may then proceed with the interconnection of one or more terminal of the GAA transistor structures through one or more levels of back-side interconnect metallization.

12 Claims, 14 Drawing Sheets

(51) Int. Cl.
   *H10D 30/62*     (2025.01)
   *H10D 62/17*     (2025.01)
   *H10D 84/01*     (2025.01)
   *H10D 84/03*     (2025.01)

(52) U.S. Cl.
   CPC ....... *H10D 84/0167* (2025.01); *H10D 84/038* (2025.01)

(56) References Cited

U.S. PATENT DOCUMENTS

| | | |
|---|---|---|
| 2010/0264496 A1 | 10/2010 | Thomas et al. |
| 2011/0031473 A1 | 2/2011 | Chang et al. |
| 2014/0269022 A1* | 9/2014 | Xie ................... H10B 10/12 438/106 |
| 2017/0018462 A1 | 1/2017 | Suk et al. |
| 2017/0084756 A1 | 3/2017 | Cheng et al. |
| 2017/0140933 A1 | 5/2017 | Lee et al. |
| 2018/0040695 A1 | 2/2018 | Smith et al. |
| 2018/0294284 A1* | 10/2018 | Tarakji ................... H01L 24/29 |
| 2019/0043560 A1 | 2/2019 | Sumbul et al. |
| 2019/0252495 A1* | 8/2019 | Bao ................... H01L 29/78684 |
| 2020/0066839 A1 | 2/2020 | Zhang et al. |
| 2020/0105756 A1 | 4/2020 | Crum et al. |
| 2020/0135929 A1* | 4/2020 | Van Dal ............ H01L 29/66439 |
| 2020/0219970 A1 | 7/2020 | Mannebach et al. |
| 2021/0257452 A1 | 8/2021 | Trivedi et al. |
| 2021/0296323 A1 | 9/2021 | Zheng et al. |
| 2021/0376162 A1* | 12/2021 | Van Dal ............ H01L 29/66439 |

OTHER PUBLICATIONS

Extended European Search Report from European Patent Application No. 20214824.3 notified Jun. 11, 2021, 10 pgs.
Notice of Allowance from European Patent Application No. 20214824.3 notified Oct. 2, 2024, 7 pgs.

* cited by examiner

DOUBLE-SIDED INTEGRATED CIRCUIT TRANSISTOR STRUCTURES WITH DEPOPULATED BOTTOM CHANNEL REGIONS

RELATED APPLICATIONS

This application is related to U.S. Ser. No. 16/146,800 filed on Sep. 28, 2018, and titled "Gate-All-Around Integrated Circuit Structures Having Depopulated Channel Structures Using Bottom-Up Approach." This application is also related to U.S. Ser. No. 16/827,570 filed on Mar. 23, 2020, and titled "Static Radom-Access Memory (SRAM) Bit Cell With Channel Depopulation."

BACKGROUND

Demand for higher performance integrated circuits (ICs) in electronic device applications has motivated increasingly dense transistor architectures. Fabricating interconnect metallization over both a front side of a transistor structure and over a back side of the transistor structure is a form of monolithic 3D integration where transistor structures are interconnected into a double-sided IC from both the front and back side. Such double-sided interconnect routing can reduce density and parasitics of the IC.

Transistor structures with different drive currents may be needed for different applications within a given IC. For finFETs architectures, one may vary the number of fins between different transistor structures to achieve different drive-currents. Gate-all-around (GAA) transistor structures, such as ribbon or wire (RoW) architectures include a plurality of channel regions that are in a vertical stack with one channel region self-aligned over another. To vary the number of channel regions, one of the GAA transistor structures may be depopulated in one stack relative to the other.

RoW depopulation techniques and double-sided transistor structures that result from such techniques may advantageously achieve different drive currents in GAA transistor structures of a double-sided IC.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
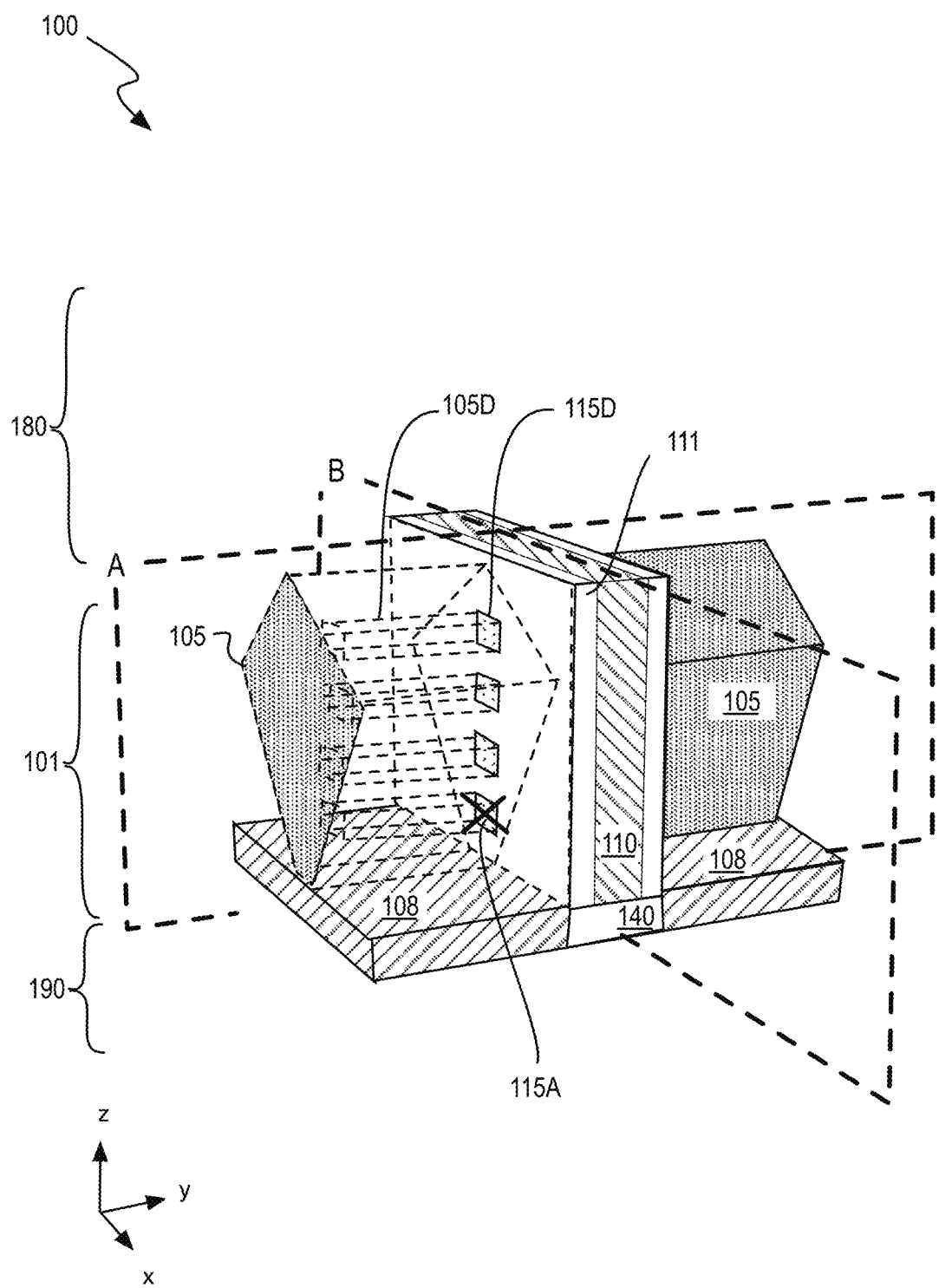
FIG. 1 illustrates a double-sided IC structure including a gate-all-around transistor structure lacking at least one active bottom channel region following back-side channel depopulation, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer disposed over or under another may be directly in contact or may have one or more intervening materials or layers. Moreover, one material or layer disposed between two materials or layers may be directly in contact with the two materials or layers or may have one or more intervening materials or layers. In contrast, a first material or material "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In accordance with some embodiments, double-sided integrated circuit transistor structures with depopulated bottom channel regions are fabricated. For transistor structures that have a number of channel regions arranged in a vertical stack between an overlying front-side metallization level and underlying back-side metallization level, the number of channel regions in a particular transistor structure may be depopulated by removing, or otherwise deactivating, a portion of the transistor structure nearest to the back-side metallization level. For a double-sided transistor structure that may be contacted from either, or both, a front side and a back side metallization level, embodiments herein may be practiced to depopulate the number of channel region in a particular transistor structure during backside processing of the IC structure.

Back-side depopulation in accordance with some embodiments may avoid complications to front-side processing that would be associated with depopulating a channel from the front side of a transistor structure Channel depopulation solutions implemented in the front-end process as part of the initial fabrication of a gate-all-around transistor (GAA) structure could further increase the complexity of the front-end process to the point of having significant IC die yield issues.

One or both of front-side and back-side channel depopulation may be practiced to arrive at a GAA transistor structure having desired operational parameters. For example, the removal or inactivation of one or more channel region in an upper portion of a transistor channel stack during initial fabrication of a GAA transistor structure may be less complicated than removal of a channel region from a lower portion the transistor channel stack. In contrast, back-side processing subsequent to an initial fabrication of a GAA transistor structure may be advantageously leveraged in the removal or inactivation of one or more channel region in a lower portion the transistor channel stack. Hence, depending from where in a channel stack a channel region is to be pruned, back-side channel depopulation in accordance with some embodiments herein may be less invasive than front-side depopulation. Indeed, even where front-side population is possible (e.g., where an upper channel region of the stack may be deactivated), it may be advantageous to instead deactivate a lower channel region of the stack so as to reduce variability in the front side features of the transistor structure.

Notably, back-side channel depopulation in accordance with embodiments herein may be employed in conjunction with front-side channel depopulation techniques, or may be employed in exclusion of front-side channel depopulation techniques to arrive at transistor structures that have fewer than a design maximum number of channel regions.

FIG. 1 illustrates a double-sided IC structure 100 that includes GAA transistor structure 101 having a plurality of stacked channel regions 115A-115D following back-side channel depopulation in accordance with some embodiments where bottom channel region 115A has been removed (and replaced with placeholder material), or otherwise deactivated, as represented by an "X". Transistor structure 101 therefore includes only three active channel regions even though transistor structure 101 has a design maximum of four channel regions. Where other transistors of a double-side IC structure include the design maximum channel regions, the illustrated backside depopulation may differentiate operational parameters of two transistors. Notably, all transistors of a double-side IC structure 100 may also be depopulated substantially as transistor structure 101, for example to electrically isolate the transistor structures from an underlying feature, such as a sub-channel material, or backside metallization feature, etc.

As further illustrated in FIG. 1, double-sided IC structure 100 includes one or more front-side metallization levels 180 over a "top" or "front" side of transistor structure 101, and one or more back-side metallization levels 190 over (under)

a "bottom" or "back" side of transistor structure 101. Structural aspects of front-side metallization levels 180 and back-side metallization levels 190 are not depicted in FIG. 1 to avoid obscuring the view of transistor structure 101. Front-side metallization levels 180 may have any known structure, and any number of levels interconnecting one or more transistor terminals with other nodes in a circuit. Similarly, back-side metallization levels 190 may have any known structure, and any number of levels interconnecting one or more transistor terminals with other nodes in the circuit. In some exemplary embodiments, there are more levels (e.g., 6-8, or more) front-side metallization levels 180 than back-side metallization levels 190 (e.g., 1-4 levels). For such embodiments, front-side metallization levels 180 may be readily distinguished from back-side metallization levels 190 even where double-side IC structure 100 is inverted from the orientation illustrated. Regardless of orientation, depopulated/inactivated channel region 115A is nearest to back-side metallization levels 190, and is therefore referred to as a "bottom," or "lower," channel region. In contrast, channel region 115D is nearest front-side metallization levels 180 and may therefore be referred to as a "top," or "upper," channel region.

In FIG. 1, two orthogonal planes are demarked by dashed line. Plane A is a "gate-cut" plane that passes through a transverse length of gate electrode 110 and passes through a longitudinal length of channel regions 115A-115D. Plane B is a "fin-cut" plane that passes through a transverse length of channel regions 115A-115D and passes through a longitudinal length of gate electrode 110. As further illustrated, source and drain regions 105 are electrically and physically coupled to opposite sides of channel regions 115A-115D. In this example, source and drain regions 105 comprise faceted epitaxial material that has been grown, for example laterally from an end portion of channel regions 115A-115D embedded with in a spacer dielectric material 111, or from cantilevered source/drain nanowire ends (e.g., 105D) drawn in dashed line.

Source and drain regions 105 need not be epitaxial material, in which case the illustrated facets may not be present. Source and drain regions 105 also need not be merged into a unitary body, in which case cantilevered source/drain nanowire ends (e.g., 105D) may be individually contacted by a terminal contact metal. In the illustrated example, back-side metallization levels 190 include a back-side source and drain metallization 108 that is in contact with source and drain regions 105. Although not depicted for the sake of clarity, front-side metallization levels 180 may include a front-side source and/or drain contact that is similarly in contact with one or more of source and drain regions 105. Likewise, front-side metallization levels 180 and/or back-side metallization levels 190 may further include a contact to gate electrode 110 (not depicted). Gate electrode 110 is between source and drain region 105, with intervening spacer dielectric material 111 between gate electrode 110 and source and drain region 105. Transistor structure 101 may further include one or more additional dielectric materials. In the illustrated example, there is a dielectric material 140 under gate electrode 110 where gate electrode 110 extends laterally beyond channel regions 115A-11D.

Figure 2A:
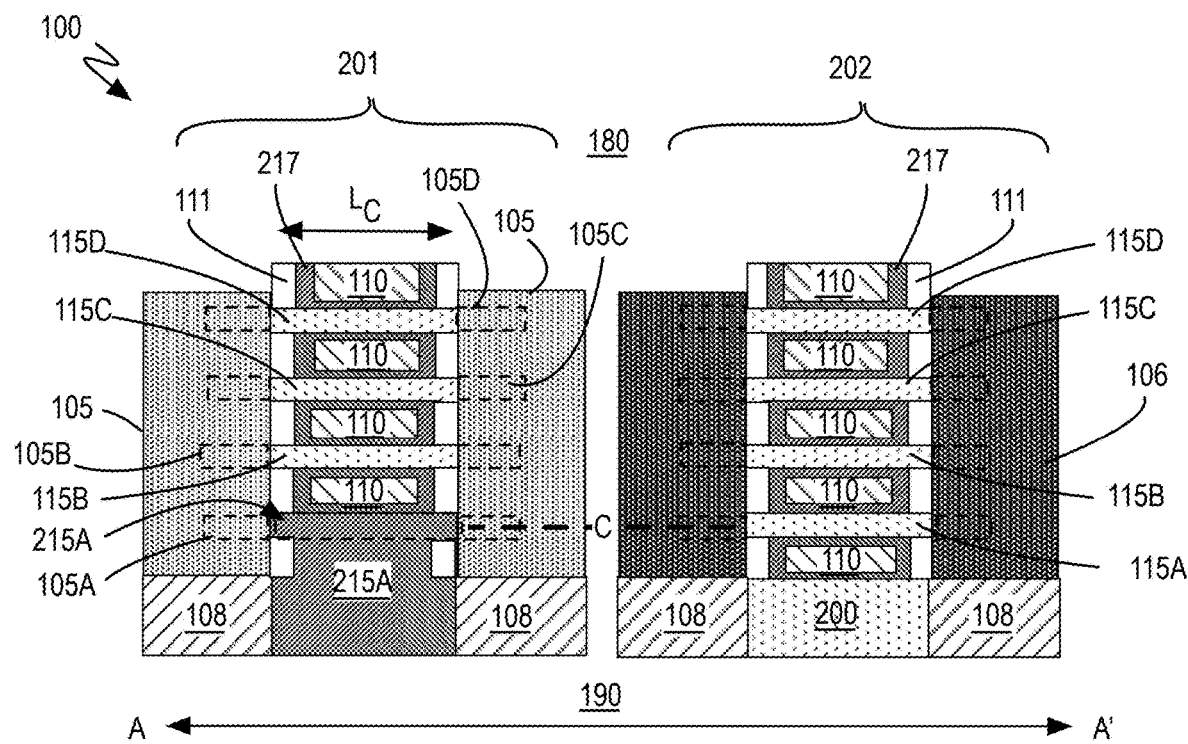
FIG. 2A illustrates a first cross-sectional view of a double-side IC structure including a first transistor structure lacking at least one active bottom channel region adjacent to a second transistor structure with a full complement of active channel regions, in accordance with some embodiments.
Figure 2B:
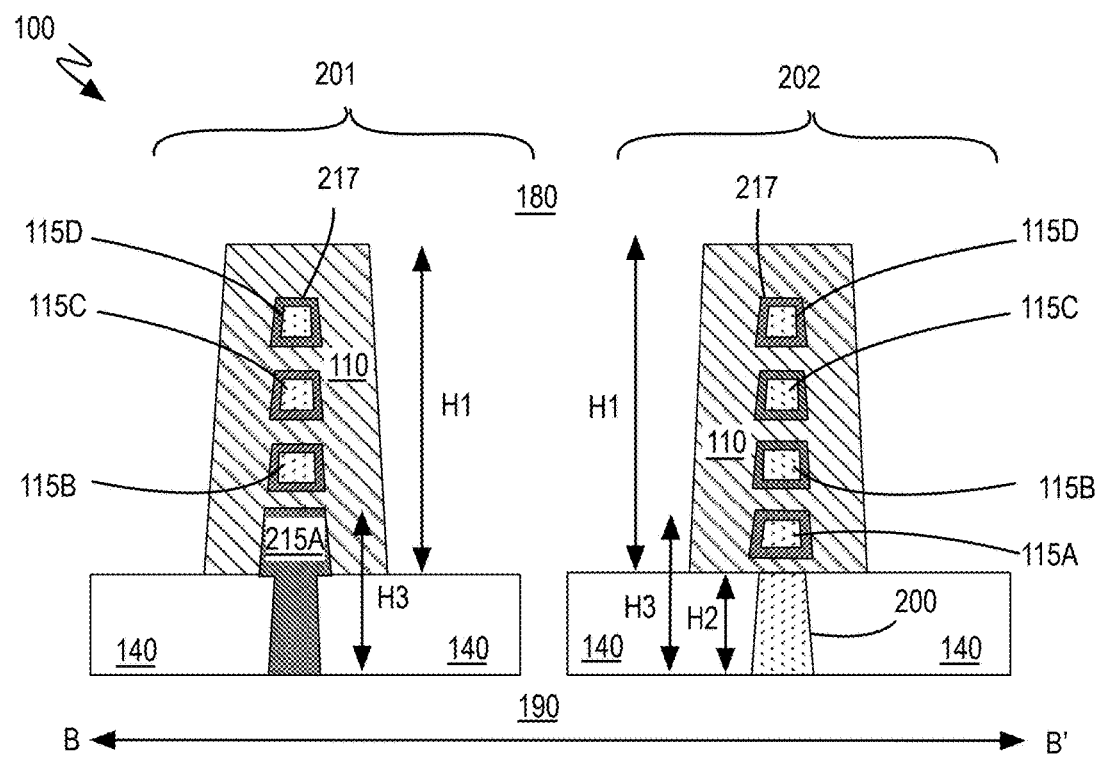
FIG. 2B illustrates a second cross-sectional view of the double-side IC structure illustrated in FIG. 2A, in accordance with some embodiments.

FIG. 2A illustrates a cross-sectional view of double-sided IC structure 100 along the A-A' plane introduced in FIG. 1, in accordance with some embodiments. FIG. 2B illustrates a second cross-sectional view of the double-side IC structure 100 along the B-B' plane introduced in FIG. 1, in accordance with some embodiments. As shown in FIGS. 2A and 2B, IC structure 100 includes a transistor structure 201 that lacks at least one active bottom channel region. Transistor structure 201 is adjacent to a transistor structure 202 that has a full complement of active channel regions. Transistor structure 201 is therefore an embodiment of transistor structure 101 (FIG. 1) including an electrically inactive channel material 215A.

Transistor structures 201 and 202 may be two transistors within any IC topology, for example where different transistor drive currents are advantageous. In some embodiments, IC structure 100 is a CMOS structure with transistor structure 201 having a first conductivity type while transistor structure 202 has a second, complementary conductivity type. In the illustrated example, transistor structure 201 is a PMOS transistor structure with source and drain region 105 having p-type conductivity, while transistor structure 202 is a NMOS transistor structure with source and drain region 106 having n-type conductivity. In other embodiments, transistor structure 201 is an NMOS transistor structure with source and drain region 105 having n-type conductivity, while transistor structure 202 is a PMOS transistor structure with source and drain region 106 having p-type conductivity. In other embodiments, transistor structures 201 and 202 are both PMOS transistor structures or both NMOS transistor structures.

Source and drain region 105, 106 is coupled together through channel regions 115B, 115C and 115D. Each of channel regions 115B-115D are operable to contribute to a total drive current for transistor structures 201, 202. Transistor structure 202 includes a bottom channel region 115A that is absent from transistor structure 201, and which increases the drive current of transistor structure 202 beyond that of transistor structure 201. In the illustrated example, transistor structure 202 therefore has four channel regions whereas transistor structure 201 has only three channel regions with an inactive channel material 215A in place of bottom channel region 115A. As shown in FIG. 2A, inactive channel material 215A is co-planar with bottom channel region 115A along a plane C demarked in dashed line. Transistor structures 201 and 202 may alternatively include any number of channel regions 115. Also, while transistor structure 201 is illustrated as lacking bottom channel region 115A, transistor structure 201 may lack any number channel regions relative to a transistor having a design maximum number of channel regions, such as transistor structure 202. For embodiments where more than one channel region is rendered inactive, two or more of the lowest channel regions, nearest back-side metallization levels 190, may be absent with inactive channel material 215 then being coplanar with one or more of channel regions 115B-115C, for example.

Source/drain semiconductor region 105 and source/drain semiconductor region 106 may comprise any semiconductor material suitable for a transistor. In some embodiments, source/drain semiconductor regions 105, 106 include impurity-doped portions of semiconductor material portions 105A-105D protruding laterally beyond channel regions 115A-115D, and denoted by dashed lines. In the illustrated embodiment, source/drain regions 105, 106 include a unified epitaxial semiconductor source/drain structure. This unified epitaxial semiconductor source/drain structure may have been grown, for example, from semiconductor material portions 105A-105D that were cantilevered beyond spacer dielectric material 111. In absence of any such cantilevered semiconductor material portions 105A-105D, a unified epitaxial source/drain semiconductor structure may have been laterally grown from surfaces of channel regions 115A-115D embedded within spacer dielectric 111. Source/drain region 105, 106 may be comprise one or more electrically active impurities. In some embodiments, for example, source/drain region 105 is a Group IV semiconductor material (e.g., Si, Ge, or SiGe alloy) with a p-type impurity, such as, but not limited to, boron or gallium. In some further embodiments, source/drain region 106 is also a Group IV semiconductor material, but with an n-type impurity, such as, but not limited to, phosphorus, arsenic, or antimony.

Channel regions 115B-115D have a longitudinal channel length LC (e.g., along y-axis) associated with a distance between source and drain region 105 in transistor structure 201. Channel regions 115B-115D may extend through dielectric (spacer) material 111, as illustrated, or not. In the illustrated example, inactive channel material 215A also has length between source and drain region 105 that is substantially equal to channel length LC. However, in other embodiments, inactive channel material 215A may have a longitudinal length significantly less than the channel length LC, for example where only some portion of channel length LC is electrically inactive material. Transistor structure 202 similarly includes channel regions 115A-115D having a longitudinal channel length (e.g., along y-axis) associated with a distance between source and drain region 106.

Channel regions 115A-115D are non-planar bodies of semiconductor material that may have been patterned from a fin in a front (top) side of a substrate material layer, for example. The trapezoidal profiles illustrated for both gate electrode 110 and channel regions 115A-115D are representative of structural asymmetry associated with front-side transistor fabrication. Such asymmetry may be a result of feature sidewall slopes that evolve during subtractive patterning of one or more of a semiconductor fin or gate electrode. Although channel regions 115A-115D are illustrated in FIG. 2B as nanowires having a transverse width approximately equal to their vertical thickness, channel regions 115A-115D may instead be nanoribbons.

In some embodiments, channel regions 115A-115D are crystalline semiconductor. Although the crystalline semiconductor includes polycrystalline thin film material, the crystalline semiconductor may be advantageously substantially monocrystalline. In some such embodiments, the crystallinity of channel regions 115A-115D is cubic with the top surfaces nearest to front-side metallization levels 180 having crystallographic orientation of (100), (111), or (110), for example. Other crystallographic orientations are also possible. In some embodiments, channel regions 115A-115D are a substantially monocrystalline group IV semiconductor material, such as, but not limited to substantially pure silicon (e.g., having only trace impurities), silicon alloys (e.g., SiGe), germanium alloys (e.g., GeSn, SiGeSn) or substantially pure germanium (e.g., having only trace impurities). In other embodiments, channel regions 115A-115D are a Group III-V alloy semiconductor material. Channel regions 115A-115D may also have any of these same exemplary compositions in alternative polycrystalline or amorphous embodiments, for example where transistor structures 201, 202 have been fabricated from a thin film semiconductor material layer. Alternative polycrystalline or amorphous embodiments may instead include semiconducting metal oxides, such as IGZO. Although channel regions 115A-115D are illustrated as having a substantially homogenous composition, they may alternatively comprise one or more semiconductor heterojunctions that, for example further include a first semiconductor material adjacent to a second semiconductor material.

Inactive channel material 215A is compositionally different from channel regions 115A-115D. Inactive channel material 215A may be any material that is inoperable as a channel material, at least under the gate bias voltages at which channel regions 115A-115D are operable and/or to which transistor structure 201 is biased during circuit operation. In some exemplary embodiments, inactive channel material 215A is a dielectric material. Suitable dielectric materials include, but are not limited to, silicon dioxide, a low-k dielectric (e.g., SiOC), silicon oxynitride, silicon nitride, or an even high-k dielectric (e.g., metal oxide).

As further illustrated in FIGS. 2A and 2B, transistor structures 201 and 202 have substantially the same gate electrode height H1. Below height H1, transistor structure 202 includes a sub-channel material 200 extending a height H2 from a nearest one of back-side metallization levels 190. Sub-channel material 200 is under the stack of channel regions 115A-115D, under gate electrode 110, and may be a base of a fin, for example, from which channel regions 115A-115D were formed. As such, sub-channel material 200 may have a composition and/or microstructure similar to channel regions 115-115D. For example, in some embodiments where channel regions 115A-115D are of a Group IV material (e.g., silicon), sub-channel material 200 is also a Group IV material (e.g., silicon). n some further embodiments where channel regions 115A-115D are substantially monocrystalline, sub-channel material 200 is also substantially monocrystalline, and has the same crystallinity and/or crystal orientation as that of channel regions 115A-115D.

In addition to lacking channel region 115A, transistor structure 201 also lacks sub-channel material 200. As shown, inactive channel material 215A is in place of both sub-channel material 200 and channel region 115A, having a height H3 from back-side metallization levels 190. In other words, inactive channel material 215A is coplanar with both sub-channel material 200 and channel region 115A. In the illustrated example, within transistor structure 201, inactive channel material 215A also occupies a region where a bottom portion of the gate stack resides within transistor structure 202. As such, for transistor structure 201, spacing between a given one of back-side interconnect metallization levels 190 and a nearest one of channel regions 115B-115D is greater than height H3. In contrast, for transistor structure 202, spacing between the given one of back-side interconnect metallization levels 190 and a nearest one of channel regions 115A-115D is less than height H3.

As further described below, transistor structure 201 may have been modified from a transistor structure that was substantially the same as transistor structure 202 through selective back-side processing that has removed sub-channel material 200, as well as channel region 115A, and replaced it with inactive channel material 215A. Notably, channel regions 115B-115D of transistor structure 201 remain advantageously unaltered from their counterpart regions of transistor structure 202, which is one of the advantages of back-side channel depopulation in accordance with embodiments herein.

As further shown in FIGS. 2A and 2B, transistor structures 201 and 202 include a gate stack further including gate electrode 110 and a gate dielectric 217 cladding channel regions 115-115D to provide gate-all-around control of channel conductivity. Gate dielectric 217 may be any dielectric material(s) known to be suitable as an insulator of a gate electrode, such as, but not limited to SiO2, SiONx. In some exemplary embodiments, gate dielectric 217 includes a high-k material (with a bulk relative permittivity greater than 8). Exemplary high-k materials include metal oxides, such as, but not limited to a metal oxide comprising predominantly aluminum (e.g., Al2O3), a metal oxide comprising predominantly magnesium (e.g., MgO), a metal oxide comprising predominantly lanthanum (e.g., La2O3), a metal oxide comprising predominantly hafnium (e.g., HfO2), or an alloy metal oxide comprising significant portions of two or more of these metals (e.g., HfAlOx). In some further embodiments, the high-k material further includes silicon. For example, metal silicates, such as, but not limited to HfSiOx, or TaSiOx may also be suitable for some semiconductor compositions (e.g., Si, Ge, SiGe, III-V). Some specific examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In the illustrated embodiment, the gate electrode 110 is shown as a single monolithic layer. However, gate electrode 110 may comprise a workfunction metal over the gate dielectric 217, and a compositionally distinct fill metal. An n-type workfunction metal may have a workfunction between about 3.9 eV and about 4.2 eV, for example. Suitable n-type work function metals include, but are not limited to, hafnium, zirconium, titanium, tantalum, aluminum, and metal carbides that include these elements (e.g., titanium carbide, zirconium carbide, tantalum carbide, hafnium carbide and aluminum carbide). A p-type workfunction metal may have a workfunction between about 4.9 eV and about 5.2 eV, for example. Suitable p-type materials include, but are not limited to, ruthenium, palladium, platinum, cobalt, nickel, and conductive metal oxides (e.g., ruthenium oxide).

Figure 3A:
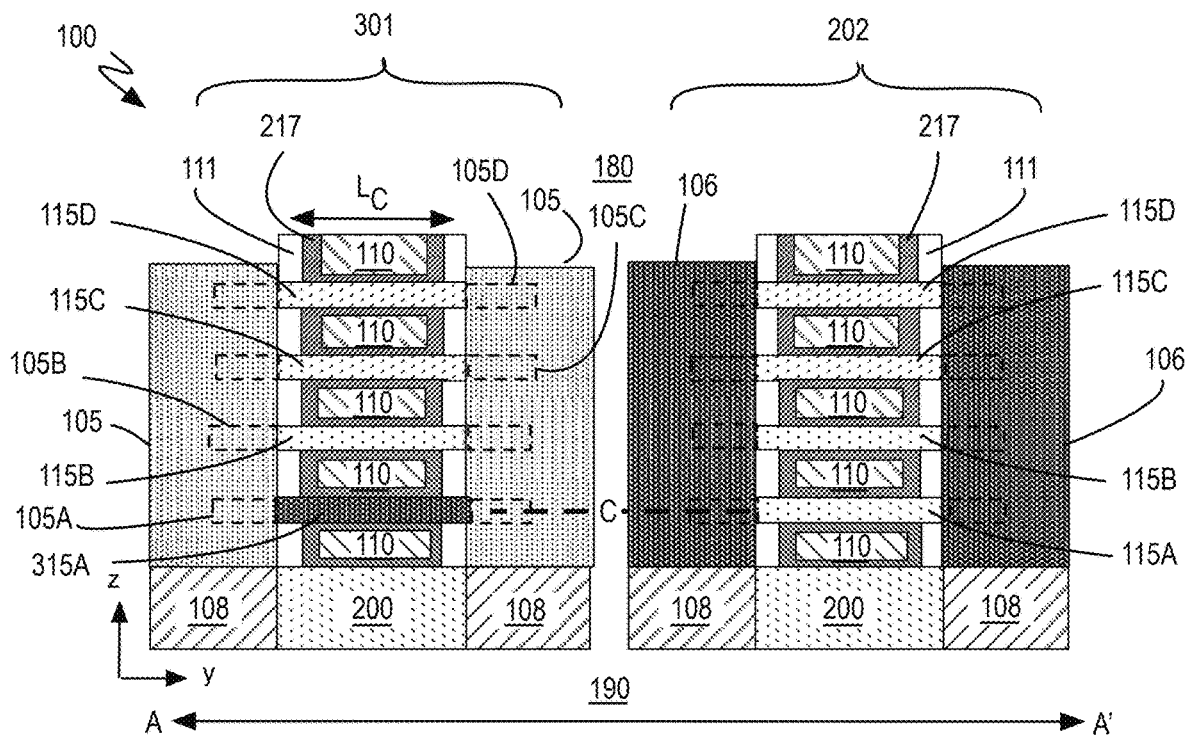
FIG. 3A illustrates a first cross-sectional view of a double-side IC structure including a first transistor structure lacking at least one active bottom channel region adjacent to a second transistor structure with a full complement of active channel regions, in accordance with some alternative embodiments.
Figure 3B:
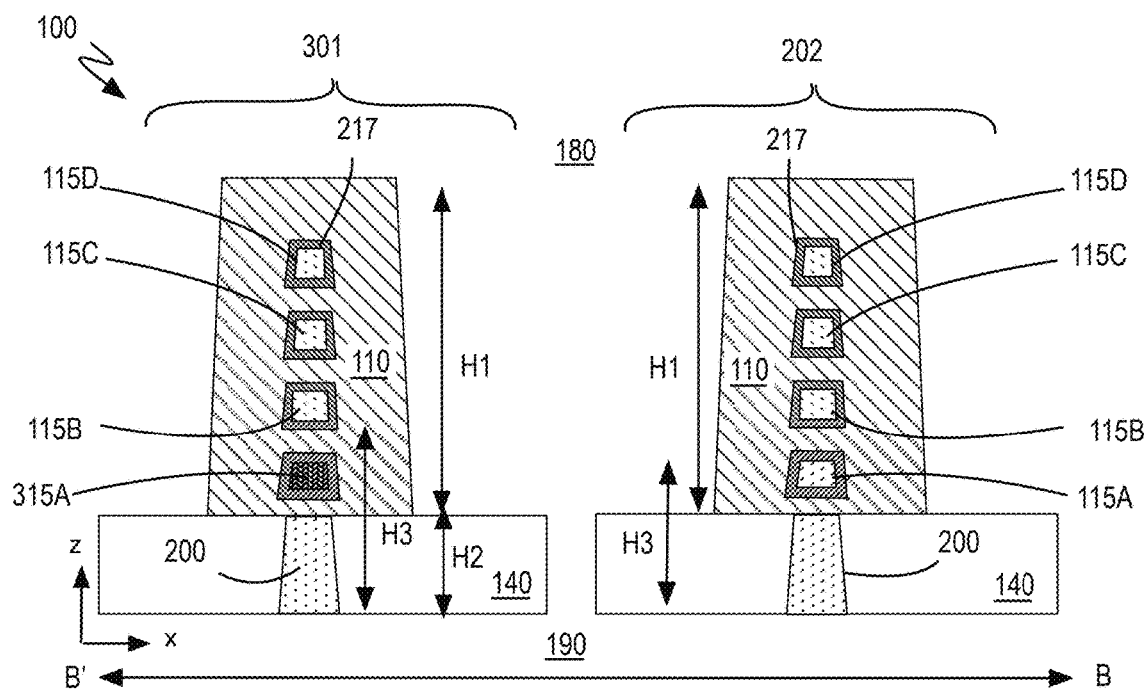
FIG. 3B illustrates a second cross-sectional view of the double-side IC structure illustrated in FIG. 3A, in accordance with some alternative embodiments.

FIG. 3A illustrates a cross-sectional view of double-sided IC structure 100 along the A-A' plane introduced in FIG. 1, in accordance with some alternative embodiments. FIG. 3B illustrates a second cross-sectional view of the double-side IC structure 100 along the B-B' plane introduced in FIG. 1, in accordance with the alternative embodiments. As shown in FIGS. 3A and 3B, IC structure 100 includes a transistor structure 301 that lacks at least one active bottom channel region. Transistor structure 301 is again adjacent to transistor structure 202 that has the full complement of active channel regions. Transistor structure 301 is therefore an alternative embodiment of transistor structure 101 (FIG. 1) that includes an electrically inactive channel material 315A.

Transistor structures 301 and 201 may be two transistors within any IC topology, for example where different transistor drive currents are advantageous. In some embodiments, IC structure 100 is a CMOS structure with transistor structure 301 having a first conductivity type while transistor structure 202 has a second, complementary conductivity type. In the illustrated example, transistor structure 301 is a PMOS transistor structure with source and drain region 105 again having p-type conductivity, while transistor structure 202 is an NMOS transistor structure with source and drain region 106 again having n-type conductivity. In other embodiments, transistor structure 301 is an NMOS transistor structure with source and drain region 105 having n-type conductivity, while transistor structure 202 is a PMOS transistor structure with source and drain region 106 having p-type conductivity. In other embodiments, transistor structures 301 and 202 are both PMOS transistor structures or both NMOS transistor structures.

Transistor structures 301 share many of the structural elements described above for transistor structures 201 and 202. The reference numbers introduced in FIGS. 2A and 2B are retained in FIGS. 3A and 3B for structural features in transistor structures 301 that have a direct analog in transistor structures 201 and 202. As in transistor structure 201, transistor structure 301 lacks a bottom channel region 115A, however there is an inactive channel material 315A that has been derived from the channel region material. For this embodiment, inactive channel material 315A may have a less dramatically different composition and/or microstructure than channel regions 115A-115D. For example, in some embodiments where channel regions 115B-115D are substantially monocrystalline, inactive channel material 315A is also substantially monocrystalline, and has the same crystallinity and/or crystal orientation as that of channel regions 115B-115D. In some embodiments, inactive channel material 315A has a greater concentration of impurities that render inactive channel material 315A inoperable as a channel material, at least under the gate bias voltages at which channel regions 115A-115D are operable. Except for the greater impurity concentration, inactive channel material 315A may be substantially the same material as channel regions 115B-115D. For example, where channel regions 115B-115D are a Group IV semiconductor material (e.g., predominantly silicon), inactive channel material 315A may also be the Group IV semiconductor material, but impurity doped to have a threshold voltage that renders inactive channel material 315A in an "off" state under all gate bias voltages that transistor structure 301 may experience during circuit operation.

In some embodiments, inactive channel material 315A includes an electrically active impurity that results in inactive channel material 315A having a conductivity type complementary to source/drain region 105. For example, where transistor structure is a PMOS device and source/drain material have p-type conductivity, inactive channel material 315A may be n-type. Complementary doping may provide junction isolation with source and drain region 105. Suitable impurities for an n-type inactive silicon channel material 315A of a PMOS device include, but are not limited to, phosphorus, arsenic, or antimony. P-type inactive channel material 315A is also possible. For example, where transistor structure 301 is instead an NMOS device, suitable impurities for an inactive p-type silicon channel material 315A include, but are not limited to, boron or gallium or indium.

Although the impurity concentration level may vary widely, in some exemplary embodiments, inactive channel material 315A has an impurity concentration in excess of 1e19 atoms/cm3 (e.g., approximately 1e20 atoms/cm3, or more). In the illustrated embodiment, substantially the entire channel length LC is impurity doped into inactive channel material 315A. For such embodiments, a co-planar portion of source/drain regions 105 (e.g., along plane C in FIG. 3A) may also be counter-doped with the same impurity present within inactive channel material 315A. Alternatively, a longitudinal length significantly less than channel length LC may be impurity doped into inactive channel material 315A. The longitudinal length of inactive channel material 315A should however at least be sufficient to avoid significant source-to-drain leakage through inactive channel material 315A.

As further illustrated in FIGS. 3A and 3B, transistor structure 301 includes sub-channel material 200 extending a height H2 from back-side metallization levels 190. As noted above, sub-channel material 200 may be a base of a fin, for example, from which inactive channel material 315A and channel regions 115B-115D were formed. As such, sub-channel material 200 may have a composition and/or microstructure similar to channel regions 115B-115D. For example, in some embodiments where channel regions 115B-115D are of a Group IV material (e.g., silicon), sub-channel material 200 is also a Group IV material (e.g., silicon). In some further embodiments where channel regions 115B-115D are substantially monocrystalline, sub-channel material 200 is also substantially monocrystalline, and has the same crystallinity and/or crystal orientation as that of channel regions 115B-115D.

Notably, a significant impurity concentration may be advantageously limited to inactive channel material 315A with channel region 115B remaining operable with an associated threshold voltage. In exemplary embodiments, the concentration of the impurity present in inactive channel material 315A is at least two orders of magnitude lower within channel regions 115B-115D, and may be advantageously three orders of magnitude, or more. Hence, channel regions 115B-115D (as well as channel region 115A of transistor structure 202) may be substantially undoped by the impurity present within inactive channel material 315A. A steep impurity gradient along the height H3 may therefore be present within transistor structure 301 with no such impurity along the height H3 in transistor structure 202. Sub-channel material 200 may, in contrast, be doped with the impurity present within inactive channel material 315A. For example, where the inactive channel material impurity is complementary to impurities in source/drain region 105, inclusion of a significant impurity concentration within sub-channel material 200 may also improve electrical isolation of sub-channel material 200. Sub-channel material 200 may alternatively have a significantly lower concentration of the impurity found in inactive channel material 315A.

In some embodiments, inactive channel material 315A has a lower degree of crystallinity that channel regions 115B-115D. Lesser long range order within inactive channel material 315A may help to confine impurities to within the inactive channel material 315A, increasing the impurity gradient along the height H3. In addition to being more amorphous, inactive channel material 315A may include one or more amorphizing impurities, such as silicon or germanium or argon or xenon or krypton or tin. For some embodiments where channel regions 115B-115D comprise predominantly silicon, the presence of germanium within inactive channel material 315A is indicative of a targeted amorphization. For other embodiments where channel regions 115B-115D comprise predominantly germanium, the presence of silicon within inactive channel material 315A is likewise indicative of a targeted amorphization. Such impurities within a majority Group IV semiconductor may impart significant lattice damage that reduces the crystallinity of inactive channel material 315A below that of channel regions 115B-115D. Although most lattice damage will occur where an amorphizing impurity comes to rest (e.g., within inactive channel material 315A), sub-channel material 200 may also incur some lesser degree of lattice damage and may also comprise some lower concentration of the one or more amorphizing impurities found at a higher concentration within inactive channel material 315A. Amorphizing impurities are advantageously substantially absent from channel regions 115B-115D (as well as 115A in transistor structure 202). So, in addition to greater crystallinity, channel regions 115B-115D may have a much lower amorphizing impurity concentration than inactive channel material 315A.

As further described below, transistor structure 301 may have been modified from a transistor structure that was substantially the same as transistor structure 202 through selective back-side implantation of impurities (electrically active or amorphizing) into channel region 115A, converting it into inactive channel material 315A. Notably, channel regions 115B-115D of transistor structure 201 remain advantageously unaltered from their counterpart regions of transistor structure 202. For example, a lack of crystal damage (i.e., high degree of crystallinity) and low (e.g., intrinsic levels) of impurities within channel regions 115B-115D are indicative of back-side channel depopulation in accordance with embodiments herein.

Figure 4:
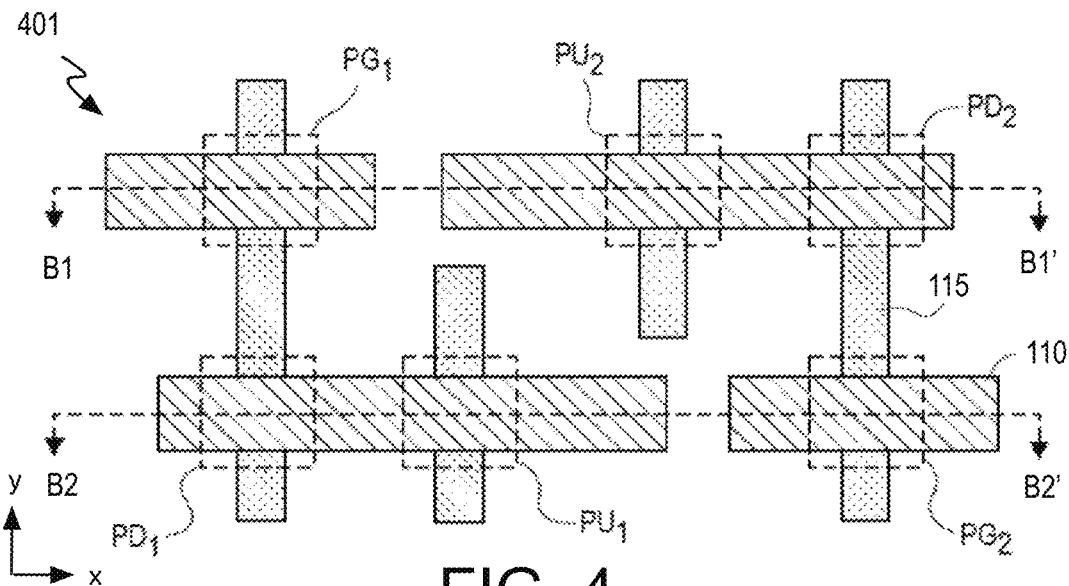
FIG. 4 is a plan view layout of a six-transistor (6-T) SRAM cell that includes multiple transistor structures, at least one of the transistor structures including a first number active channel regions, and at least a second of the transistor structures including a second number of active channel regions, in accordance with some embodiments.

The ability to vary drive current across different transistors within a single IC may take a variety of forms and have a number of advantages. For example, assist circuitry that would otherwise be required to accommodate a uniform drive current across all transistors may be avoided. Drive current modulation through backside channel depopulation in accordance with some embodiments herein may be particularly beneficial to SRAM cells of a double-sided IC. FIG. 4 is a plan view layout of a six-transistor (6-T) SRAM cell that includes multiple transistor structures, at least one of the transistor structures including a first number active channel regions, and at least a second of the transistor structures including a second number of active channel regions, in accordance with some embodiments. In SRAM cell 401, a plurality of channel regions 115 and gate electrodes 110 are interconnected by both front-side and back-side metallization levels (not depicted).

SRAM cell 401 comprises a pair of PMOS pull-up transistors (PU1 and PU2), a pair of NMOS pass-gate transistors (PG1 and PG2), and a pair of NMOS pull-down transistors (PD1 and PD2). In a typical architecture (i.e., where all transistors have the same number of channel regions), the read stability and write-ability can be unbalanced, and assist circuitry (not shown) is needed. However, in accordance with some embodiments, the PU1 and PU2 transistors have the transistor structure 201 or 301 while PG1 and PG2 and PD1 and PD2 all have transistor structure 202. Hence, the drive strength of the PU transistors will be less than that of the PD and PG transistors. As such, better balance between the read stability and write-ability may be provided, potentially eliminating the need for assist circuits, and reducing IC area and/or IC power consumption.

Figure 5A:
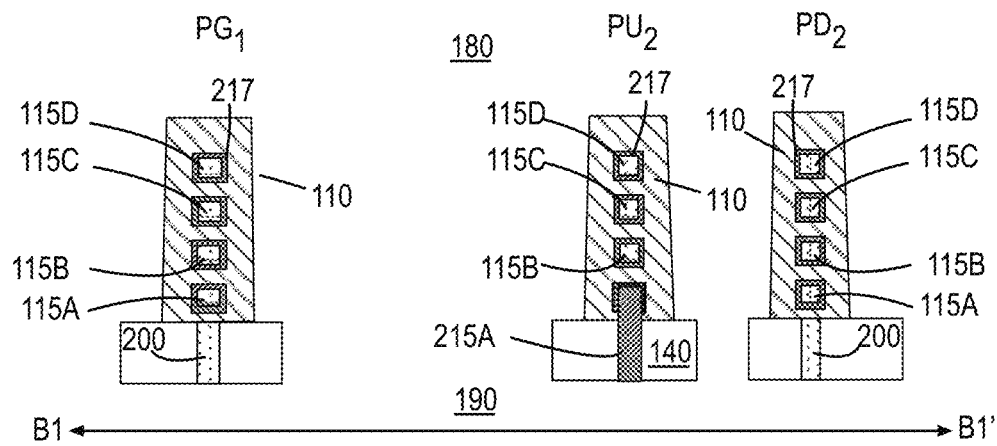
FIG. 5A is a cross-sectional view through a first plurality of transistors in the 6-T SRAM cell illustrated in FIG. 4, in accordance with some embodiments.
Figure 5B:
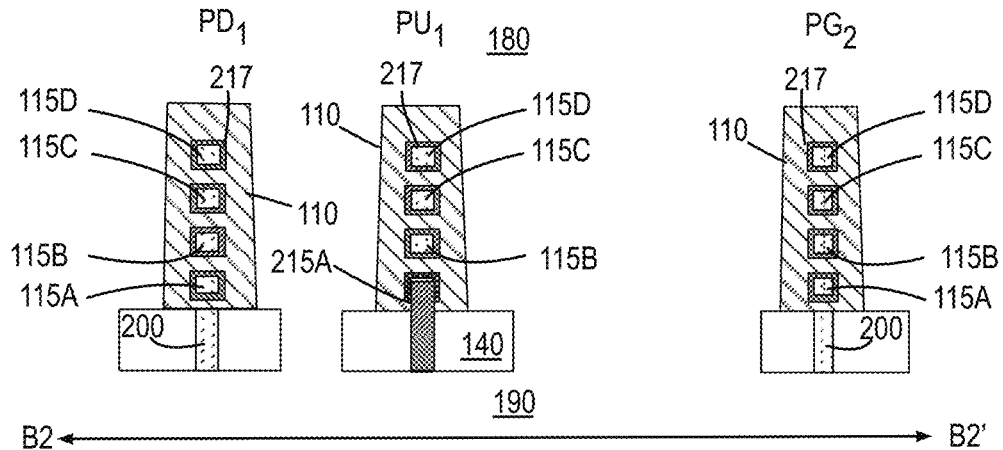
FIG. 5B is a cross-sectional view through a second plurality of transistors in the 6-T SRAM cell illustrated in FIG. 4, in accordance with some embodiments.

FIG. 5A is a cross-sectional view through a first plurality of transistors in the 6-T SRAM cell 401 along the B1-B1' line, in accordance with some embodiments. FIG. 5B is a cross-sectional view through a second plurality of transistors in the 6-T SRAM cell 401 along the B2-B2' line, in accordance with some embodiments. As shown, the PG1, PG2, PD1, and PD2 transistors each have the design maximum number (e.g., four) of channel regions (e.g., 115A-115D). The PU1 and PU2 transistors each have an inactive channel material 215A and less than the design maximum number of channel regions (e.g., only three channel regions 115B-115D). In alternative embodiments, PU1 and PU2 transistors each instead have at least one inactive channel material 315A, for example having the transistor structure 301 rather than transistor structure 201.

Figure 6:
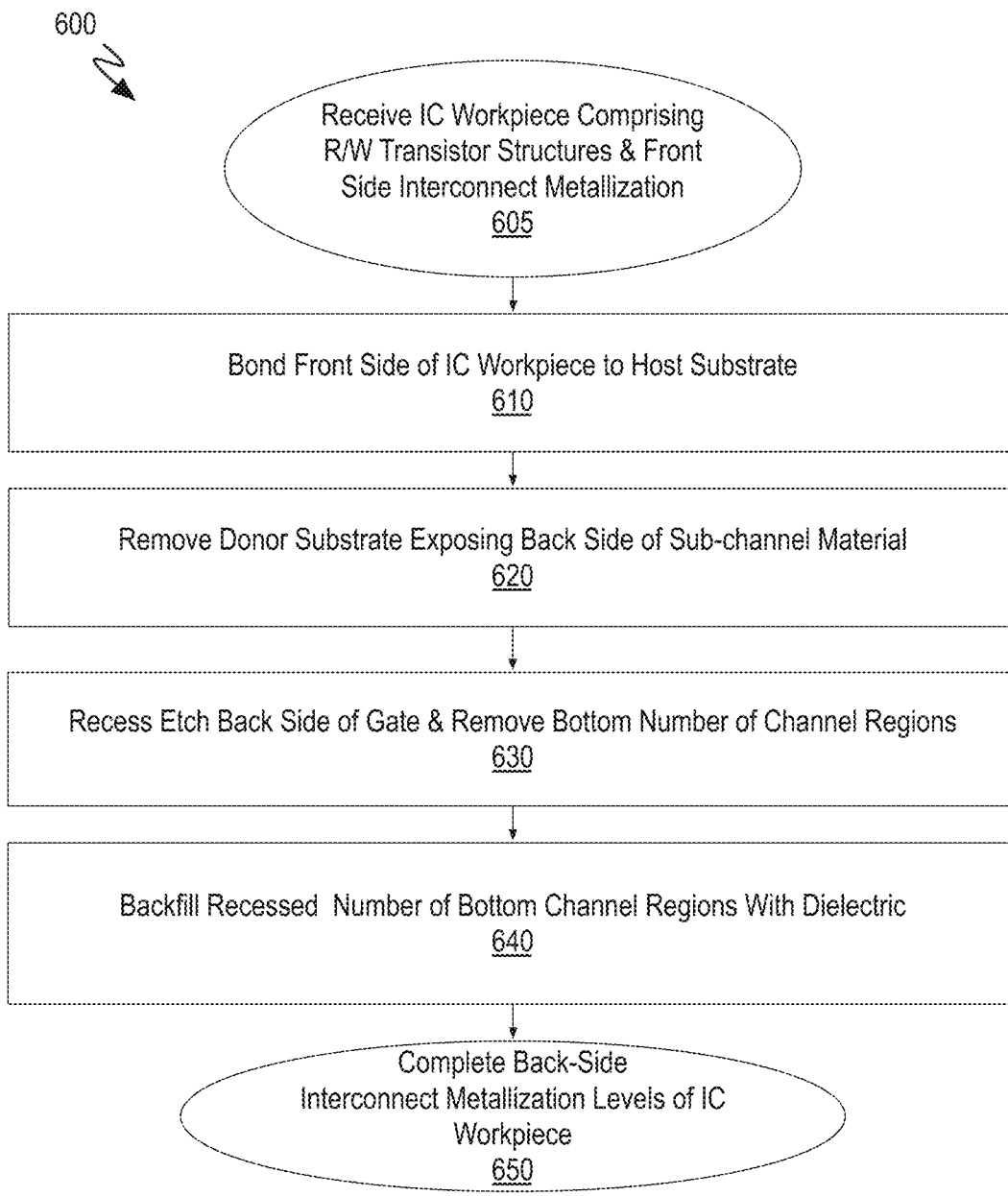
FIG. 6 is a flow diagram illustrating methods of depopulating one or more channel regions from the back side of a RoW transistor structure, in accordance with some embodiments.

The transistor structures lacking a bottom channel region described above may be fabricated according to a number of techniques. FIG. 6 is a flow diagram illustrating methods 600 for depopulating one or more bottom channel regions of a RoW transistor structure, in accordance with some embodiments. FIG. 7A-7F illustrate cross-sectional views of two transistor structures in a double-side IC structure evolving during the practice of methods 600 to provide a different number of channel regions in transistor structures 201 and 202 (FIG. 2A-2B).

Referring first to FIG. 6, methods 600 begin at input 605 where an IC workpiece with a ribbon or wire (RoW) transistor structures is received. In exemplary embodiments, the IC workpiece includes a plurality of RoW transistor structures over an area of substrate, such as a semiconductor wafer, that is to become in IC chip. The IC workpiece may be substantially complete through both a front-end-of-line process (FEOL) where the transistor structures were fabricated, and a back-end-of-line process (BEOL) where front-side metallization levels interconnecting the transistor structures have been completed.

At block 610, a front side of the IC workpiece is bonded, at least temporarily, to a handle or host substrate. Any bonding technique (e.g., wafer-level) suitable for the IC workpiece may be performed at block 610. In the example illustrated in FIG. 7A, a suitable host substrate 702 has been bonded to an uppermost material layer of front-side metallization levels 180. Front-side metallization levels 180 is illustrated in dashed line to emphasize front-side metallization levels 180 may include any number of BEOL interconnect metallization levels. With host substrate 702 supporting the IC workpiece, the composite IC workpiece may be inverted, as further illustrated in FIG. 7B, to subject a back-side of a donor substrate 701 to back-side processing.

Figure 7A:
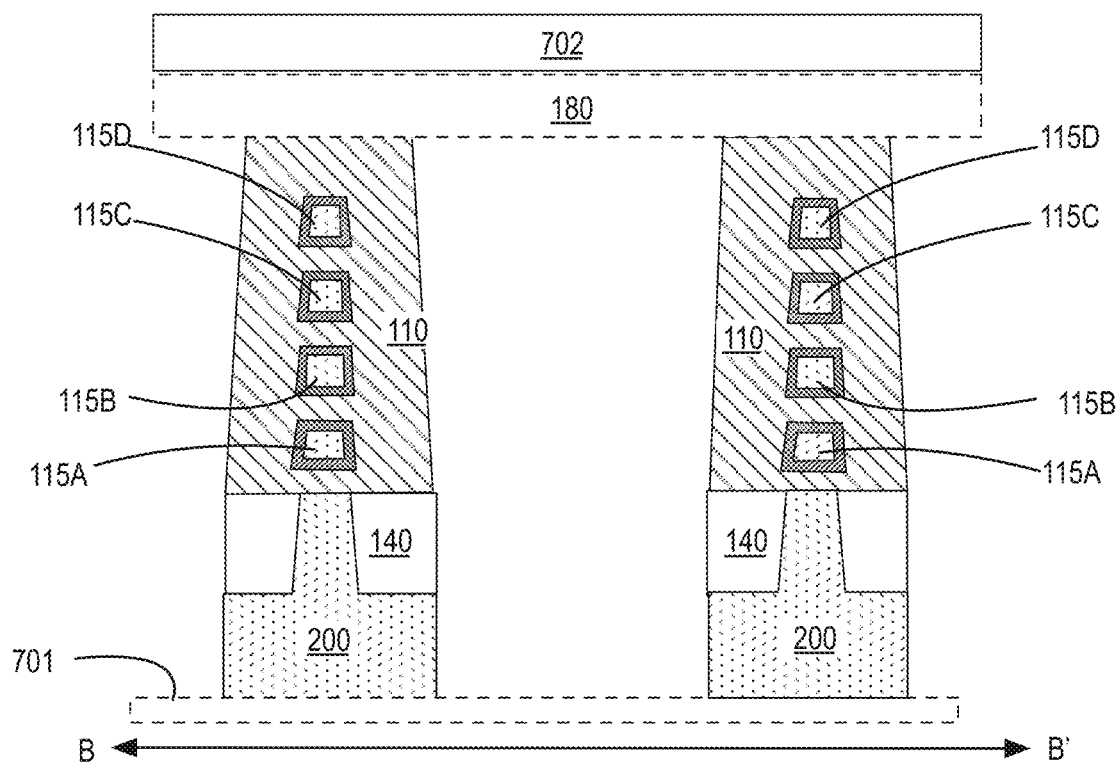
FIGS. 7A, 7B, 7C, 7D, 7E, and 7F illustrate cross-sectional views of two transistor structures in a double-side IC structure evolving to include a different number of channel regions, in accordance with some embodiments.
Figure 7B:
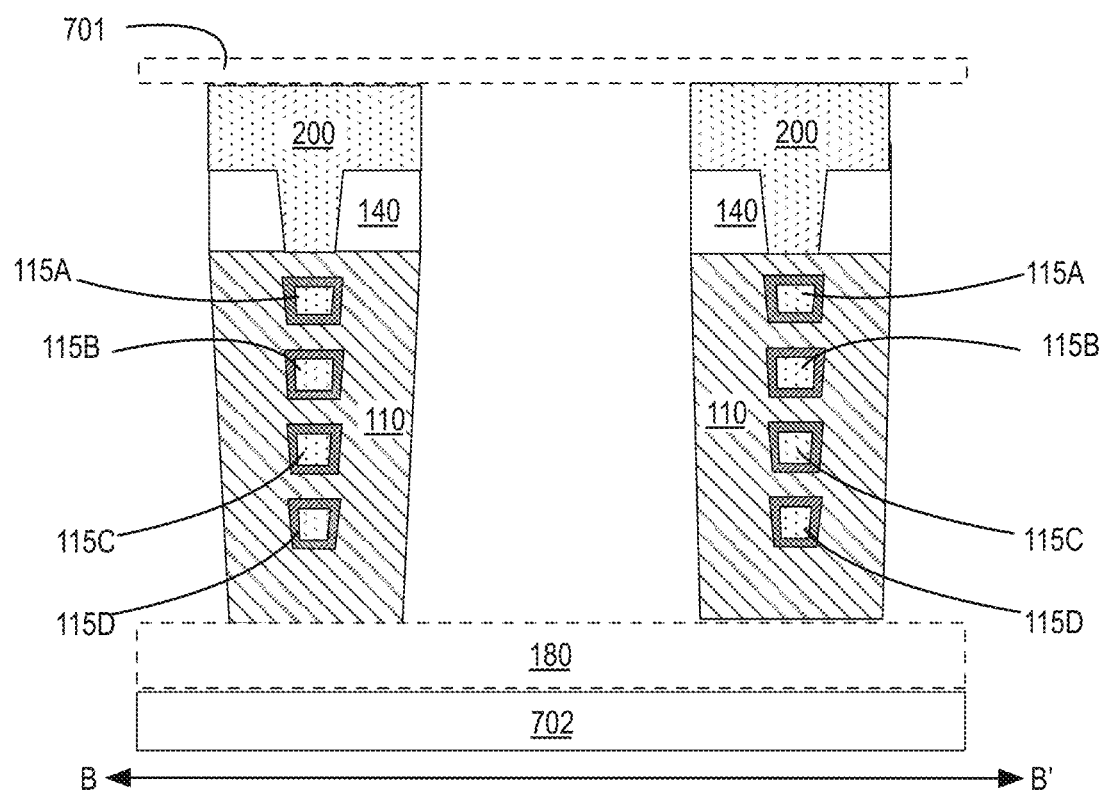
Figure 7C:
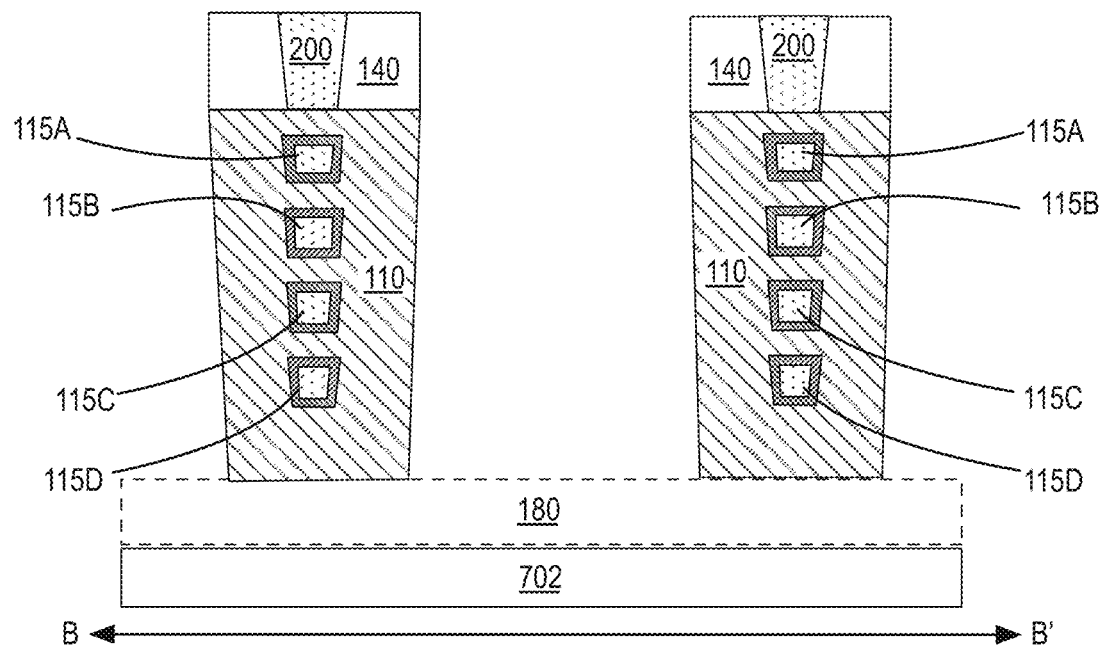
Figure 7D:
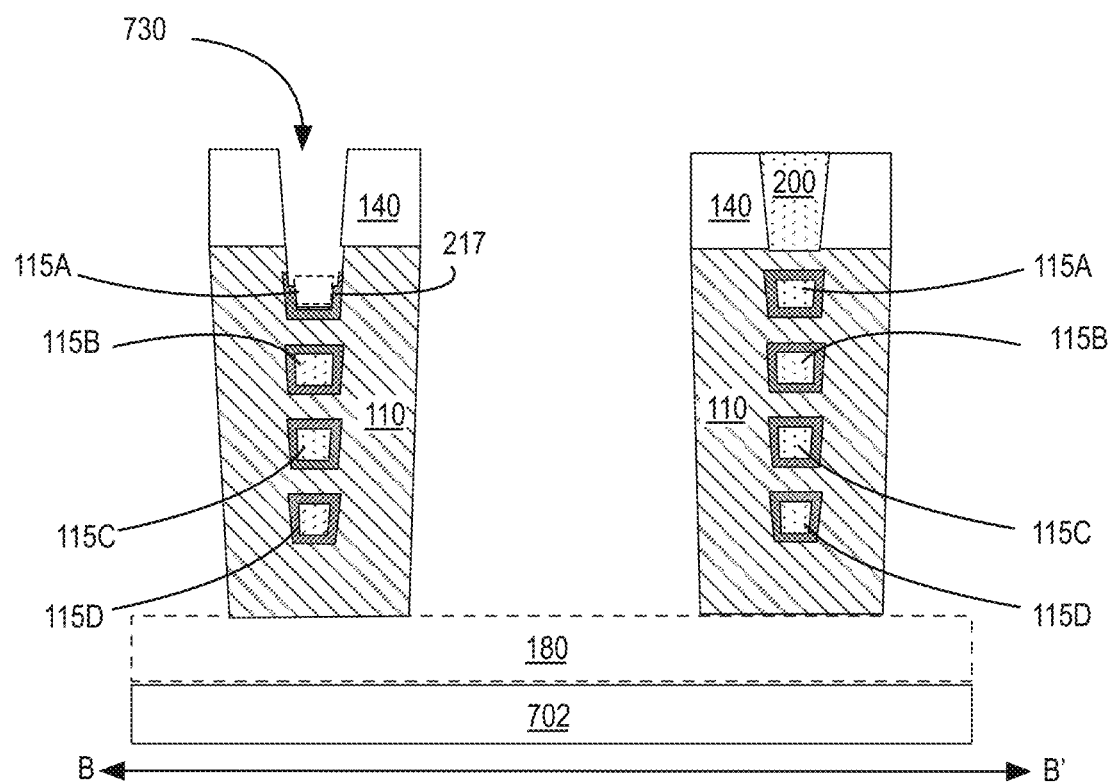
Figure 7E:
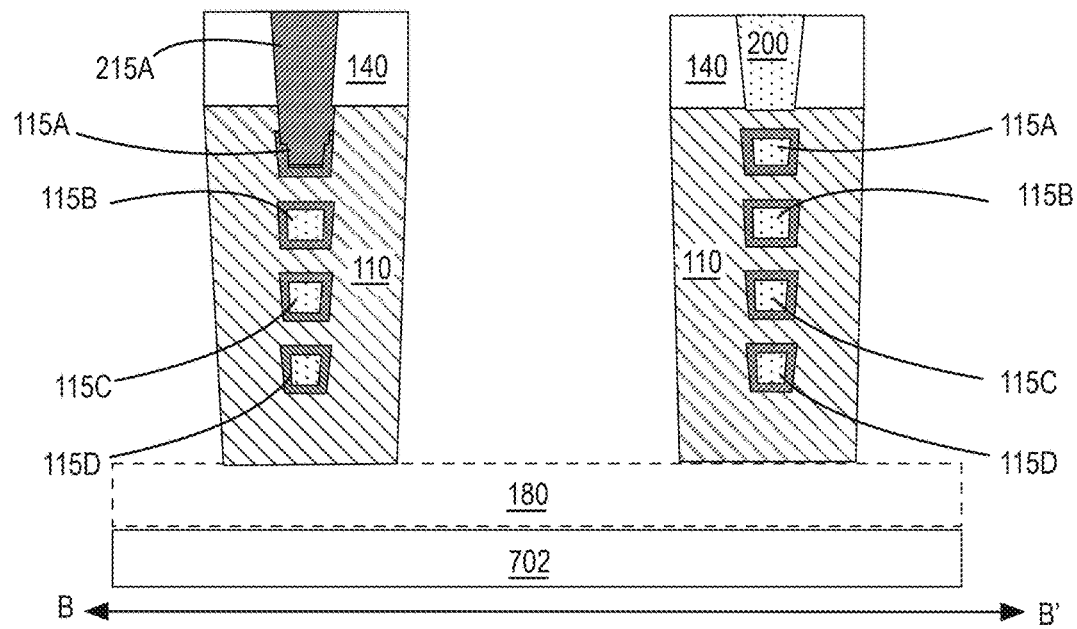
Figure 7F:
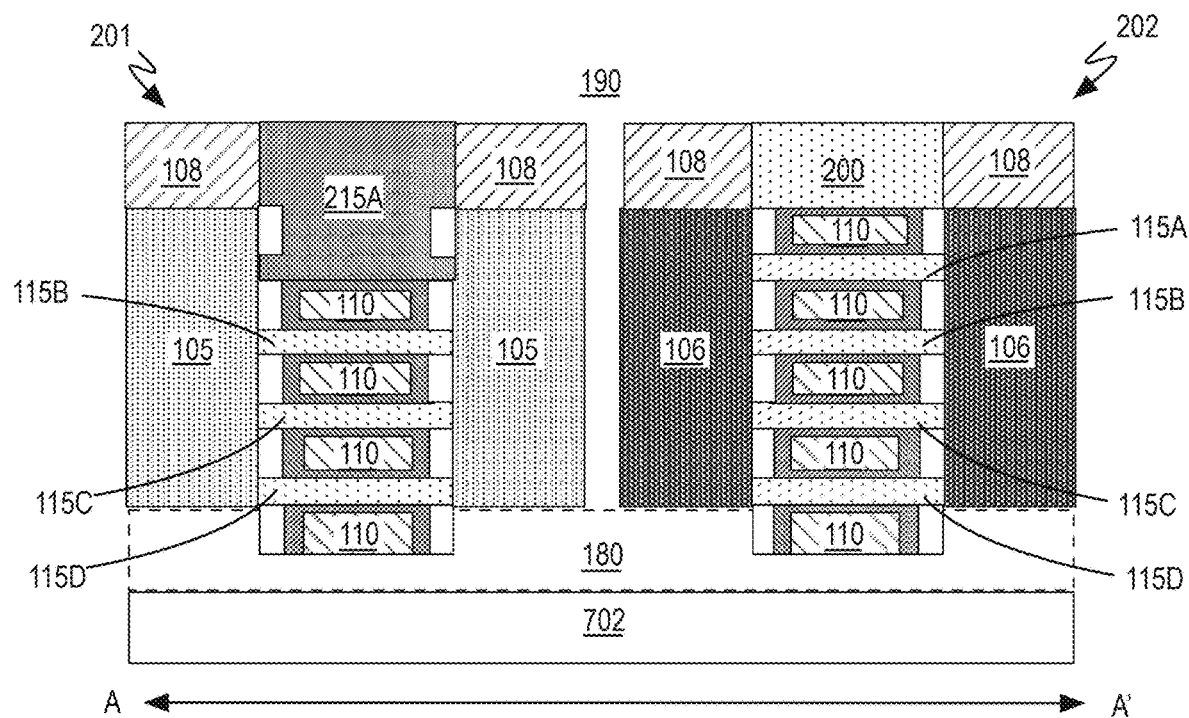

Returning to FIG. 6, methods 600 continue at block 620 where the back-side processing proceeds with removal or thinning of the host substrate to reveal a back side of transistor structures within the IC workpiece. FIG. 7C further illustrates an example where at least a portion of a donor substrate 701 has been removed exposing a back-side of sub-channel material 200. Removal of donor substrate 701 may entail a polish (e.g., CMP) and/or a wet or dry (e.g., plasma) etch process. Any grind, polish, and/or wet/dry etch process known to be suitable for the composition of the donor substrate 701 may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, removal of donor substrate 701 entails a cleaving or fracture process that removes a substantial portion of the donor substrate thickness, reducing the polish or etch time required. For example, donor substrate 701 is 400-900 μm of, for example, silicon, 100-700 μm may be cleaved off by practicing any blanket implant known to promote a wafer-level fracture. In some exemplary embodiments, a light element (e.g., H, He, or Li) is implanted to a uniform target depth within the donor substrate where the fracture plane is desired. Donor substrate material removal may be continued until an endpoint criteria is met. As further illustrated in FIG. 7C, for example, donor substrate material removal may be terminated upon exposing dielectric material 140, which surrounds some portion of sub-channel material 200.

Returning to FIG. 6, methods 600 continue to block 630 where a bottom number of channel regions are removed with one or more etch process suitable for the materials encountered during a back-side recess etch. In the example further illustrated in FIG. 7D, a back-side etch process selective to sub-channel material 200 has been employed to form a recess 730 that exposed a back side of gate electrode 110. Recess 730 is further advanced through a back-side (bottom) thickness of gate electrode 110, for example with another etch process that is selective to the composition of gate electrode 110. Recess 730 is further advanced through a back-side (bottom) thickness of gate dielectric 217, which exposes a back-side of channel region 115A illustrated in dash line. Channel region 115A is also etched away, for example with any etch process (wet chemical or dry plasma) suitable for the composition of channel region 115A (e.g., silicon, SiGe, Ge, etc.). With channel region 115A removed, advancement of recess 730 may halted, or continued to remove one or more additional channel regions 115B-115D, to complete block 630 (FIG. 6). Notably, in the illustrated example the backside recess etching is substantially self-aligned, requiring only an etch mask that protects adjacent transistor structures that are to retain the design maximum number of channel regions.

Methods 600 continue to block 640 where the recess formed at block 630 is backfilled with a material that will be electrically inactive. For example, in some embodiments, the channel regions removed from a transistor structure at block 630 are replaced with a dielectric material. In the example illustrated in FIG. 7E, electrically inactive channel material 215A is deposited into recess 730. Any suitable deposition process and/or planarization process may be employed to at least partially backfill recess 730.

Returning to FIG. 6 with one or more transistor structures now depopulated of one or more lower channel regions, methods 600 end at output 650 where a back-side interconnect metallization levels of the IC workpiece are completed. Any other back-side processing may also be completed to arrive at a final double-side IC structure. In the example illustrated in FIG. 7F (which is along the A-A' plane of FIG. 1), back-side source/drain contact metallization 108 is formed as a first of one or more back-side metallization levels 190. In some embodiments the formation of back-side source/drain contact metallization 108 entails an (e.g., unmasked, self-aligned) etch of dielectric material 140 with an etchant that is selective to the composition of dielectric material 140 relative to that of inactive channel material 215A. Any metal deposition process and planarization process may then be practiced to arrive at the transistor structures 201 and 202.

Figure 8:
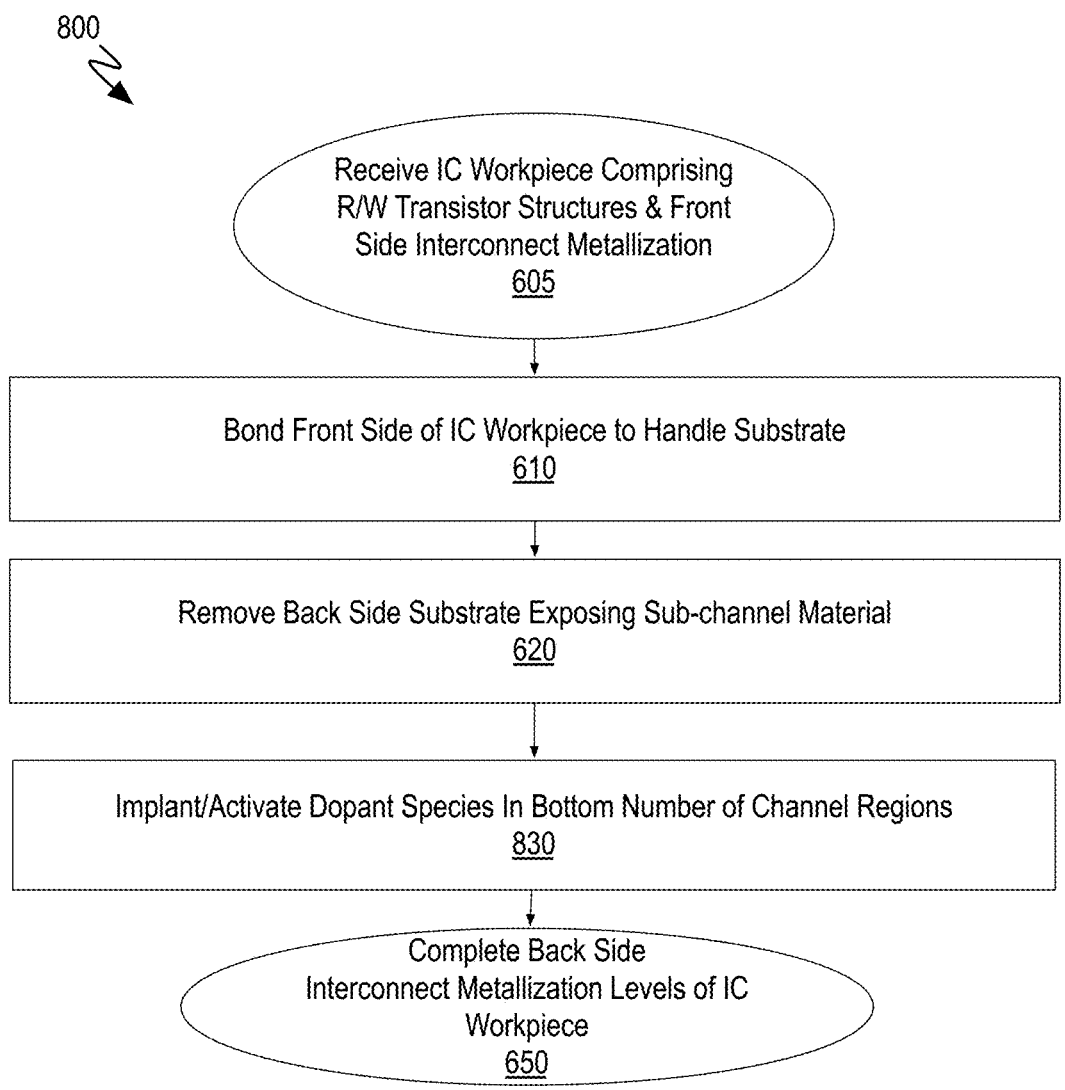
FIG. 8 is a flow diagram illustrating methods of depopulating one or more channel regions from a back side of a RoW transistor structure, in accordance with some embodiments.

FIG. 8 is a flow diagram illustrating methods 800 for depopulating one or more bottom channel regions of a RoW transistor structure, in accordance with some alternative embodiments relying on ion implantation from a back side of an IC workpiece. FIG. 9A-9D illustrate cross-sectional views of two transistor structures in a double-side IC structure evolving during the practice of methods 800 to provide a different number of active bottom channel regions in transistor structures 301 and 202 (FIG. 3A-3B).

Referring first to FIG. 8, methods 800 again begin at input 605 where an IC workpiece with RoW transistor structures is received. In exemplary embodiments, the IC workpiece includes a plurality of RoW transistor structures over an area of substrate, such as a semiconductor wafer, that is to become in IC chip. The IC workpiece may be substantially complete through both a front-end-of-line process (FEOL) where the transistor structures were fabricated, and a back-end-of-line process (BEOL) where front-side metallization levels interconnecting the transistor structures have been completed.

At block 610, a front side of the IC workpiece is bonded, at least temporarily, to a host or handle substrate. Any bonding technique (e.g., wafer-level) suitable for the IC workpiece may be performed at block 610, substantially as described above. Methods 800 continue at block 620 where the host substrate is removed to reveal a back side of transistor structures within the IC workpiece, for example substantially as described above, to arrive at the exemplary structure further illustrated in FIG. 9A.

Returning to FIG. 8, methods 800 proceed to block 830 where one or more ion implantations are performed to implant one or more impurities into a number of transistor channel regions. In some embodiments, a pre-amorphization implant is performed from the back side of the IC workpiece so that the species is implanted through a depth of the transistor to come to rest within one or more of the lower channel regions that are to be electrically deactivated. In some further embodiments, one or more impurities that can be eclectically activated may be similarly implanted from the back side of the IC workpiece so that the impurity similarly comes to rest within one or more of the lower channel regions that are to be electrically deactivated. In the example further illustrated in FIG. 9B, an n-type impurity (n−) is illustrated as being implanted to achieve a concentration profile qualitatively represented as peaking at a plane of channel region 115A within one of the transistor structures. An amorphization species concentration may be implanted to achieve a similar impurity concentration profile.

In some embodiments, a pre-amorphization species is implanted into the transistor structure, through any sub-channel material exposed on the back side. Species implantation may be with an incident angle that is substantially normal to a back-side surface of the transistor structures (i.e., with no tilt). As such, the pre-amorphization and/or electrically active dopant species will only enter the channel regions through the bottom channel region 115A. The energy of the implantation process may be chosen to isolate the majority of the pre-amorphization and/or electrically active dopant species within the bottom channel region 115A. For example, an implantation energy of a silicon or germanium pre-amorphization species may be between approximately 1 keV and approximately 2 keV. Such an implant may induce a change in crystallinity of channel region 115A. Notably, additional channel regions 115B-115D (from the bottom-up) may also be altered to amorphize more than one channel region.

Implanted dopants that can be electrically activated similarly only enter the stack through the back side, encountering a desired number of bottom channel regions. In embodiments where a pre-amorphization implant is performed, a secondary implant may be subsequently performed without an annealing process between the two implant processes. As such, the disrupted crystal structure of channel region 115A is maintained and the n-species concentration profile may be made more peaked to ensure channel region 115B may remain active.

Figure 9A:
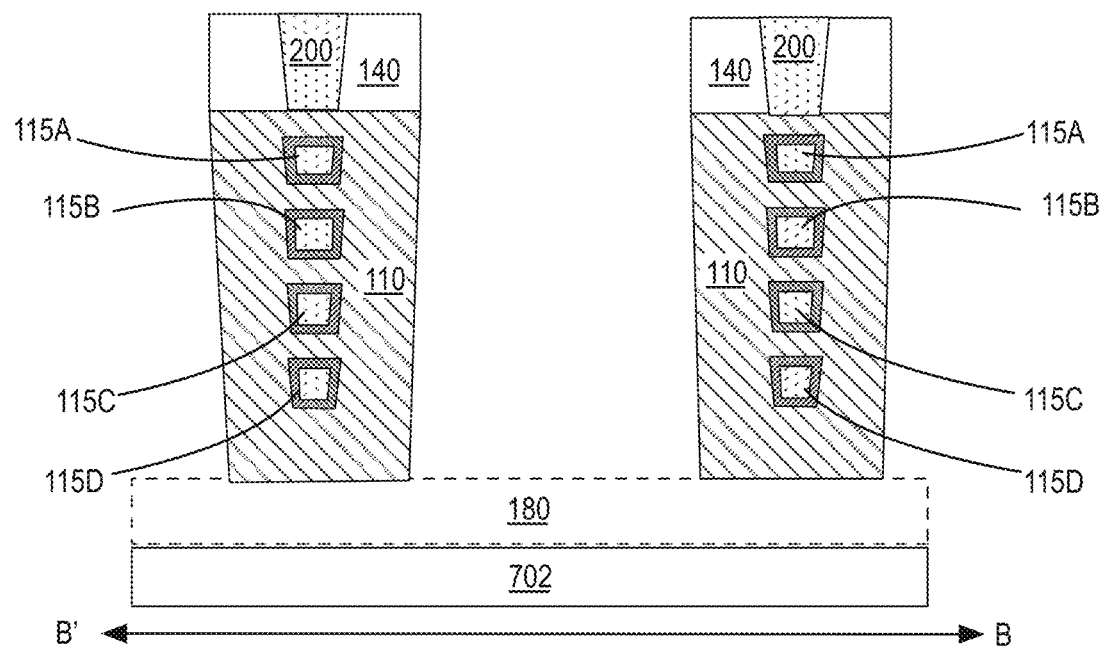
FIGS. 9A, 9B, 9C, and 9D illustrate cross-sectional views of two transistor structures in a double-side IC structure evolving to include a different number of channel regions, in accordance with some embodiments.
Figure 9B:
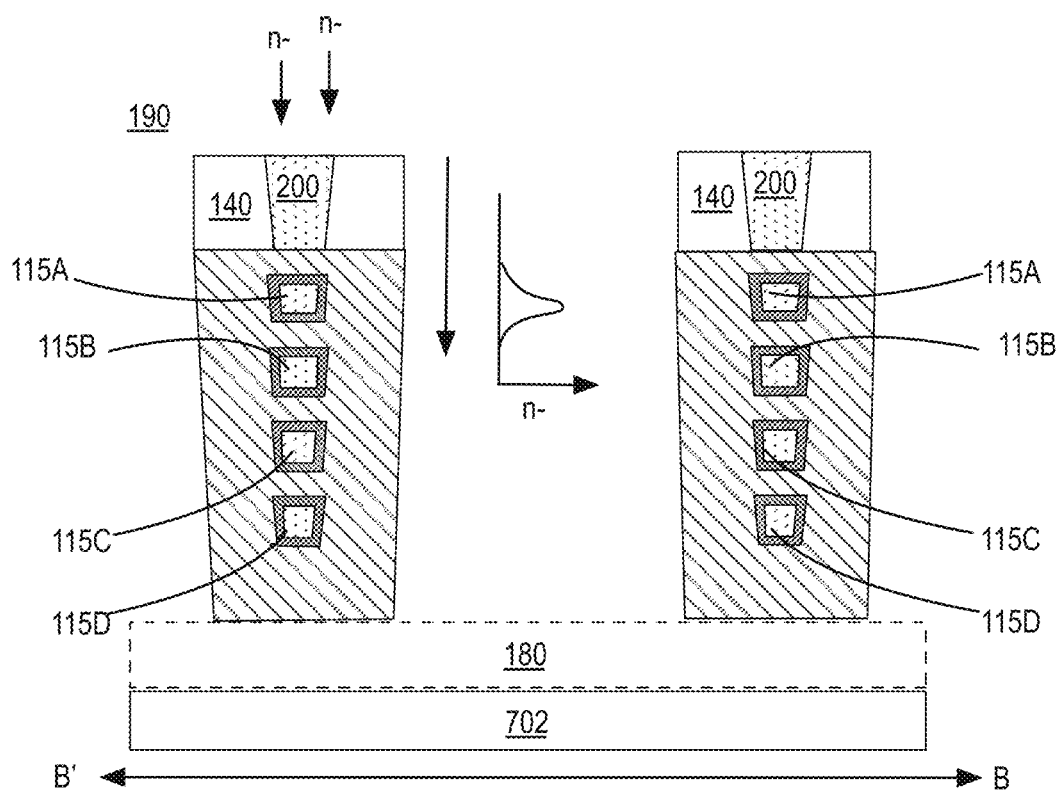
Figure 9C:
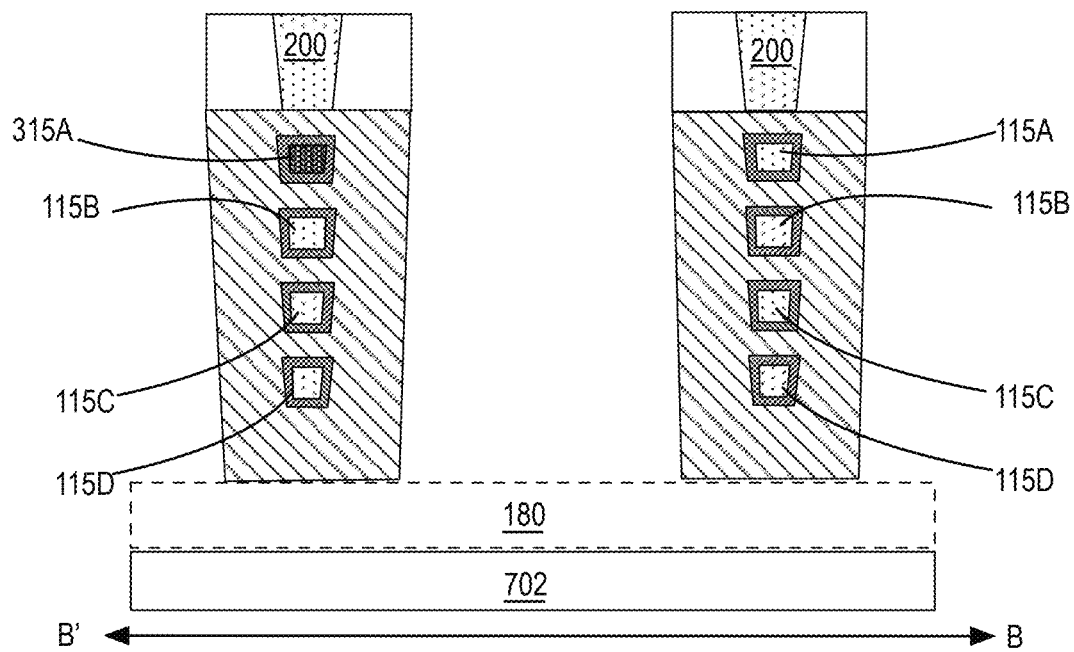
Figure 9D:
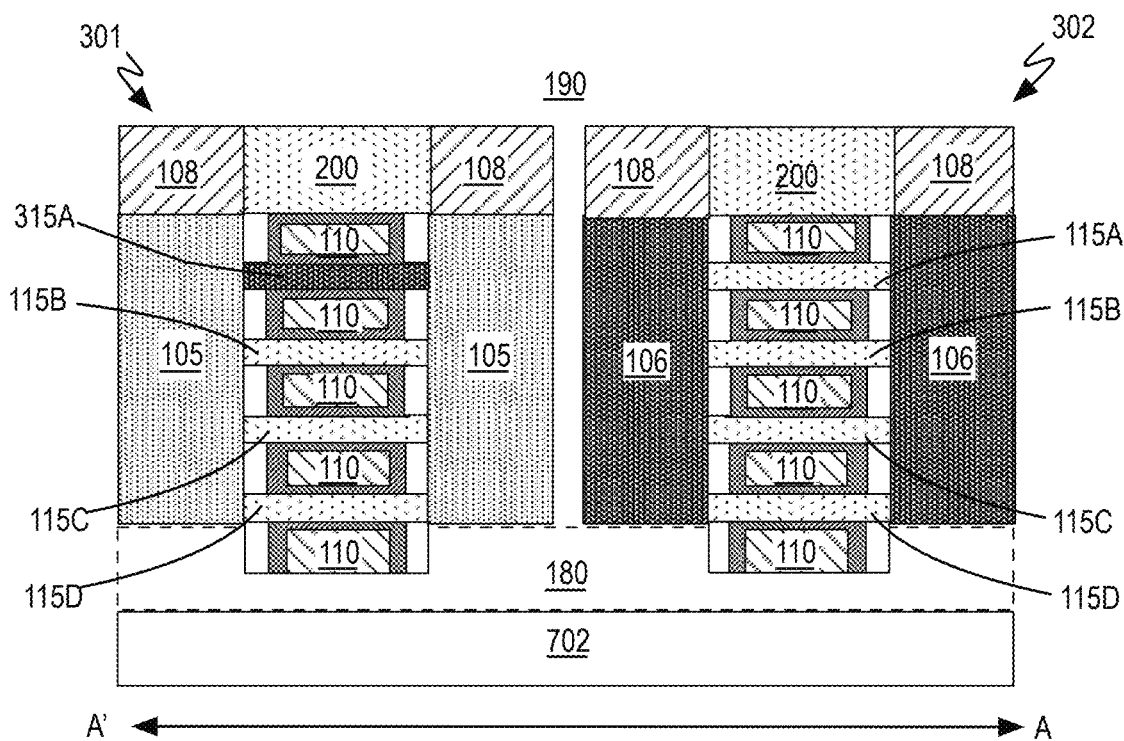

In some embodiments, the n-impurity is implanted with an energy in the range of 1-2 keV. However, a higher energy may be employed to increase impurity concentrations deeper into the IC workpiece, for example within an additional number of channel regions (e.g., 115B-115D). In some further embodiments, sub-channel material 200 may also be impurity doped by the back-side implantation employed to deactivate one or more channel regions. Notably, the only mask required during the backside implantation process(es) is one which protects various adjacent structures that are to retain a full complement of channel regions. Following the impurity implant, a short (flash) activation anneal may be performed to electrically active some percentage of the impurities implanted into channel region 115A sufficient to render it inactive channel material 315A, as illustrated in FIG. 9C.

Returning to FIG. 8 with one or more one or more lower channel regions now electrically deactivated, methods 800 complete at output 650 where back-side interconnect metallization levels of the IC workpiece are completed. Any other back-side processing may also be completed to arrive at a final double-side IC structure. In the example illustrated in FIG. 9D (which is along the A-A' plane of FIG. 1), back-side source/drain contact metallization 108 has been formed as a first of one or more back-side metallization levels 190. In some embodiments, formation of back-side source/drain contact metallization 108 entails an (unmasked, self-aligned) etch of dielectric material 140 with an etchant that is selective to the composition of dielectric material 140 relative to that of inactive channel material 315A (e.g., selective to n-type silicon). Any metal deposition process and planarization process may then be practiced to arrive at the transistor structures 301 and 202 substantially as described above.

Figure 10:
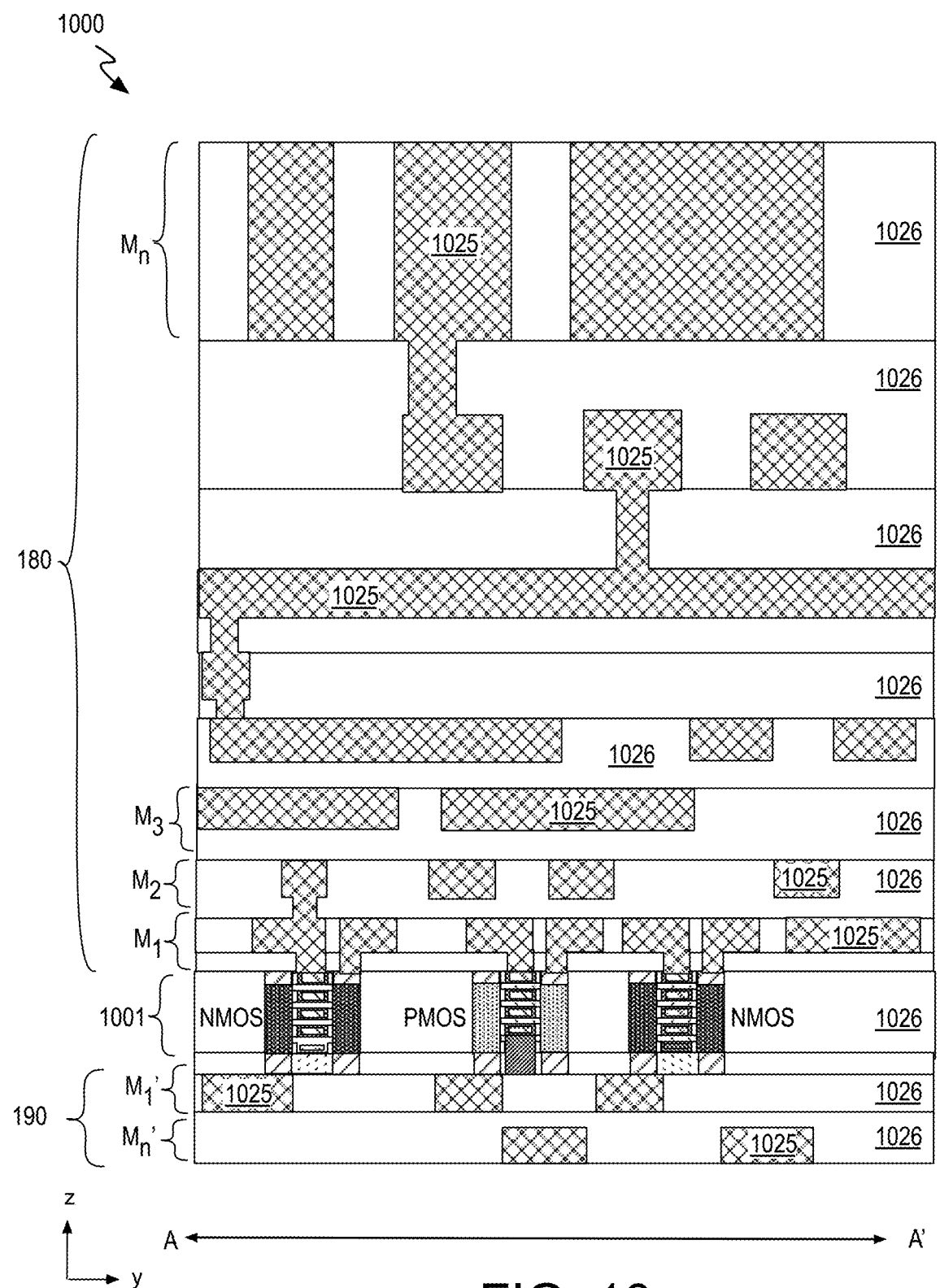
FIG. 10 is a cross-sectional view of a double-sided 3D IC structure, in accordance with some embodiments.

FIG. 10 is a cross-sectional view of a double-sided IC structure 1000, in accordance with some embodiments. Double-sided IC structure 1000 illustrates a portion of a monolithic IC that includes FEOL interconnect metallization levels 180 over and/or on a front side of transistor structures 1001 that include RoW transistor structures, one or more of which have been depopulated of one or more lower (back-side) channel regions.

Within double-sided IC structure 1000, front-side interconnect metallization levels 180 include interconnect metallization 1025 electrically insulated by dielectric material 1026. In the exemplary embodiment illustrated, front-side interconnect metallization levels 180 includes metal-one (M1), metal-two (M2), metal-three (M3) and metal-n (Mn) interconnect metallization levels. Interconnect metallization 1025 may be any metal(s) suitable for IC interconnection. Interconnect metallization 1025, may be, for example, an alloy of predominantly Cu, an alloy of predominantly W, an alloy of predominantly Ru, an alloy of predominantly Al, an alloy of predominantly Mo, etc. Dielectric material 1026 may be any dielectric material known to be suitable for electrical isolation of monolithic ICs. In some embodiments, dielectric material 1026 comprises silicon, and at least one of oxygen and nitrogen. Dielectric material 1026 may be SiO, SiN, or SiON, for example. Dielectric material 1026 may also be a low-K dielectric material (e.g., having a dielectric constant below that of SiO2).

Double-sided IC structure 1000 further includes back-side interconnect metallization levels 190. Within interconnect metallization levels 190, interconnect metallization 1025 is again electrically insulated by dielectric material 1026. Back-side metallization levels 190 may comprise any number of metallization levels over, or on, a back side of transistor structures 1001. In the illustrated example back-side metallization levels 190 include a metallization level M1' through nearest to transistor structures 1001 (e.g., opposite M1) through an uppermost back-side metallization level Mn'.

Although IC structure 1000 includes one level of transistor structures 1001, there may be multiple levels of transistor structures located within the various interconnect metallization levels, for example where a front-side metallization level of one IC structure has been bonded to a back-side metallization level of another IC structure to arrive at a composite 3DIC.

In the example shown in FIG. 10, transistor structures 1001 includes one or more PMOS GAA transistor structures having a smaller number of channel regions than one or more NMOS GAA transistor structures. In other embodiments, one or more NMOS GAA transistor structures have a smaller number of channel regions than one or more PMOS GAA transistor structures. In other embodiments, one or more first PMOS GAA transistor structures have a smaller number of channel regions than one or more second PMOS GAA transistor structures. In still other embodiments, one or more first NMOS GAA transistor structures have a smaller number of channel regions than one or more second NMOS GAA transistor structures. For any of the GAA transistor structure having few channel regions, one or more lower channel regions may have been depopulated according to any of the back-side techniques described herein to arrive at any of the structures described elsewhere herein.

Figure 11:
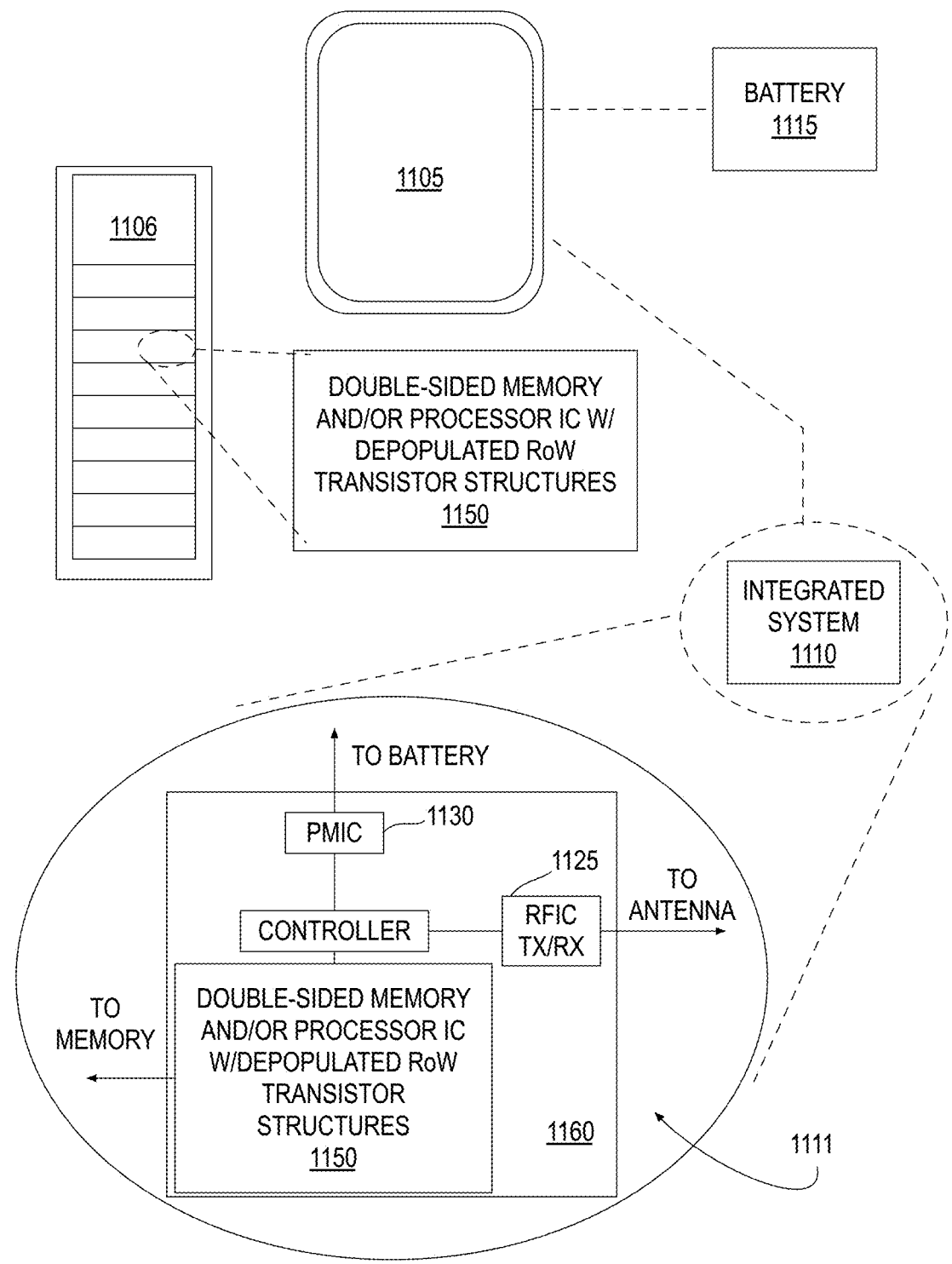
FIG. 11 illustrates a mobile computing platform and a data server machine employing an IC including a transistor structures having a different number of channel regions, in accordance with embodiments.

The transistor structures with varying number of channel regions, and the methods of back-side channel depopulation described herein may be integrated into a wide variety of ICs and computing systems that include such ICs. FIG. 11 illustrates a system in which a mobile computing platform 1105 and/or a data server machine 1106 employs an IC with including a double-sided memory and/or microprocessor IC with depopulated RoW transistor structures, for example in accordance with some embodiments described elsewhere herein. The server machine 1106 may be any commercial server, for example including any number of high-performance computing platforms within a rack and networked together for electronic data processing, which in the exemplary embodiment includes a monolithic IC 1150. The mobile computing platform 1105 may be any portable device configured for each of electronic data display, electronic data processing, wireless electronic data transmission, or the like. For example, the mobile computing platform 1105 may be any of a tablet, a smart phone, laptop computer, etc., and may include a display screen (e.g., a capacitive, inductive, resistive, or optical touchscreen), a chip-level integrated system 1110, and a battery 1115.

Whether disposed within the integrated system 1110 illustrated in the expanded view 1111, or as a stand-alone packaged chip within the server machine 1106, IC 1150 may include memory circuitry (e.g., RAM), and/or a logic circuitry (e.g., a microprocessor, a multi-core microprocessor, graphics processor, or the like) at least one of which further includes one or more back-side depopulated RoW transistor structures, for example in accordance with some embodiments described elsewhere herein. IC 1150 may be further coupled to a board, a substrate, or an interposer 1160 that further hosts one or more additional ICs, such as power management IC 1130 and radio frequency IC 1125. RFIC 1125 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 12:
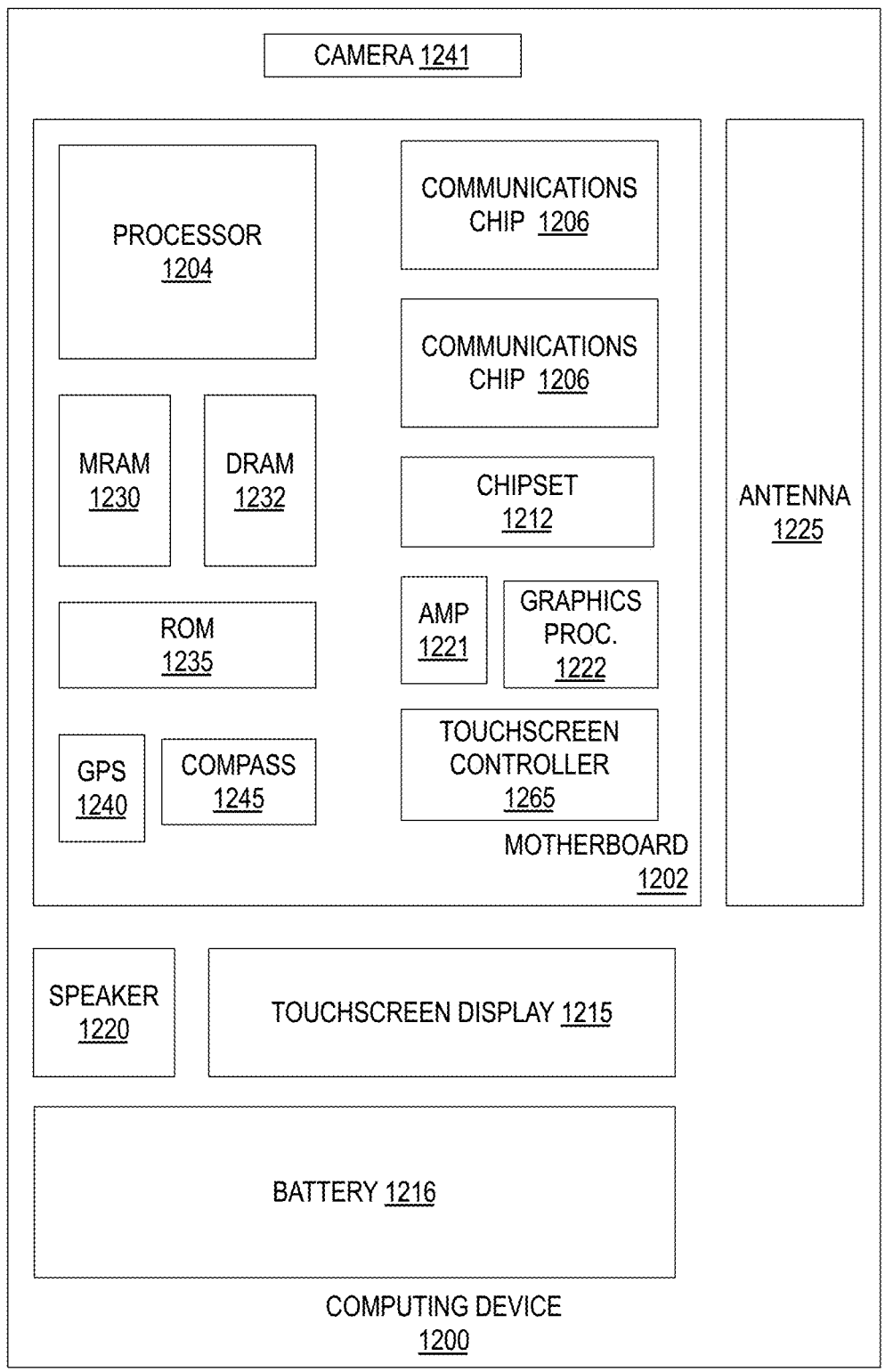
FIG. 12 is a functional block diagram of an electronic computing device, in accordance with some embodiments.

FIG. 12 is a functional block diagram of an electronic computing device 1200, in accordance with some embodiments. Device 1200 further includes a motherboard 1202 hosting a number of components, such as, but not limited to, a processor 1204 (e.g., an applications processor). Processor 1204 may be physically and/or electrically coupled to motherboard 1202. In some examples, processor 1204 is part of a monolithic IC structure including one or more back-side depopulated RoW transistor structures, as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1206 may also be physically and/or electrically coupled to the motherboard 1202. In further implementations, communication chips 1206 may be part of processor 1204. Depending on its applications, computing device 1200 may include other components that may or may not be physically and electrically coupled to motherboard 1202. These other components include, but are not limited to, volatile memory (e.g., DRAM 1232), non-volatile memory (e.g., ROM 1235), flash memory (e.g., NAND or NOR), magnetic memory (MRAM 1230), a graphics processor 1222, a digital signal processor, a crypto processor, a chipset 1212, an antenna 1225, touchscreen display 1215, touchscreen controller 1265, battery 1216, audio codec, video codec, power amplifier 1221, global positioning system (GPS) device 1240, compass 1245, accelerometer, gyroscope, speaker 1220, camera 1241, and mass storage device (such as hard disk drive, solid-state drive (SSD), compact disk (CD), digital versatile disk (DVD), and so forth, or the like.

Communication chips 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1206 may implement any of a number of wireless standards or protocols, including, but not limited to, those described elsewhere herein. As discussed, computing device 1200 may include a plurality of communication chips 1206. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first embodiments, an integrated circuit (IC) structure comprises a first interconnect metallization level, a second interconnect metallization level, and first and second transistor structures between the first interconnect metallization level and the second interconnect metallization level. The first transistor structure comprises a first gate electrode around a stack of a first number of channel regions. The second transistor structure comprises a second gate electrode around a stack of a second number of channel regions, greater than the first number of channel regions. A first spacing between the second interconnect metallization level and a nearest one of the first number of channel regions is greater than a second spacing between the second interconnect metallization level and a nearest one of the second number of channel regions.

In second embodiments, for any of the first embodiments, the first transistor structure further comprises a first source region coupled to a first drain region through the first number of channel regions, and the first source region and the first drain region have a first conductivity type. The second transistor structure further comprises a second source region coupled to a second drain region through the second number of channel regions, the second source region and the second drain region have a second conductivity type, complementary to the first conductivity type.

In third examples, for any of the first through second examples an IC structure further comprises an inactive semiconductor material between the nearest one of the first number of channel regions and the second interconnect metallization level. The inactive semiconductor material is substantially coplanar with the nearest one of the second number of channel regions, and the inactive semiconductor material has the second conductivity type with an impurity concentration exceeding that in the first number of channel regions.

In fourth examples, for any of the first through third examples the first channel regions have a first channel length between the first source and the first drain, and the inactive semiconductor material also has the first channel length.

In fifth examples, for any of the first through fourth examples, the first transistor structure is a PMOS transistor structure and the first conductivity type is p-type. The second transistor structure is an NMOS transistor structure and the second conductivity type is n-type. The impurity comprises at least one of P, Ar, or Sb, and the impurity concentration is at least 1e19 cm−3.

In sixth examples, for any of the third examples the IC structure further comprises a monocrystalline material between the second interconnect metallization level and the nearest one of the first number of channel regions. The monocrystalline material is also between the second interconnect metallization level and the nearest one of the second number of channel regions.

In seventh examples, for any of the sixth examples, the monocrystalline material has a lower concentration of the impurity than the inactivated semiconductor material.

In eighth examples for any of the second examples the IC structure further comprises a dielectric material between the nearest one of the first number of channel regions and the second interconnect metallization level. The dielectric material is substantially coplanar with the nearest one of the second number of channel regions.

In ninth examples, for any of the eighth examples the dielectric material is between a portion of the first source region and a portion of the first drain region.

In tenth examples, for any of the ninth examples the first number of channel regions have a first channel length, and the dielectric material has at least the first channel length.

In eleventh examples, for any of the ninth through tenth examples the second metallization level is coupled to at least one of the first source region or the first drain region through a contact metallization located between the second metallization level and a portion of the first source or the first drain that is adjacent to the dielectric material.

In twelfth examples, a static random access memory (SRAM) cell structure comprises a pair of pull-up transistor structures. Individual ones of the pull-up transistor structures comprise a gate electrode around individual ones of a first number of channel regions in a stack. The SRAM cell structure further comprises a pair of pull-down transistor structures. Individual ones of the pull-down transistor structures comprise a gate electrode around individual ones of a second number of channel regions in a stack. The SRAM cell structure further comprises a pair of pass-gate transistor structures. Individual ones of the pass-gate transistor structures comprise a gate electrode around individual ones of a third number of channel regions in a stack. The SRAM cell structure further comprises a first interconnect metallization level over a first side of the transistor structures and coupled to one or more of the pass-gate, pull-up, or pull-down transistor structures. The SRAM cell structure further comprises a second interconnect metallization level under a second side of the transistor structures and coupled to one or more of the pass-gate, pull-up, or pull-down transistor structures. The first number of channel regions is less than both the second number of channel regions and the third number of channel regions. A first spacing between the second interconnect metallization level and a nearest one of the first number of channel regions is greater than a second spacing between the second interconnect metallization level and a nearest one of the second number of channel regions.

In thirteenth examples, for any of the twelfth examples the pull-up transistor structure further comprises an inactive semiconductor material or dielectric material between a portion of a source region and a drain region further coupled to the first number of channel regions.

In fourteenth examples, for any of the thirteenth examples the computer system comprises a power supply and an IC die coupled to the power supply, the IC die comprising the integrated circuit (IC) structure of the first through eleventh examples.

In fifteenth examples, for any of the thirteenth through fourteenth examples, the computer system further comprises a battery coupled to the power supply.

In sixteenth examples, a method of fabricating an IC structure comprises receiving a workpiece comprising transistor structures and front-side interconnect metallization, the transistor structures comprising a stack of a first number of channel regions. The method comprises exposing a back side of the transistor structures by removing or thinning a back-side substrate from the workpiece. The method further comprises removing or disabling one or more of the channel regions nearest to the back-side of the workpiece in at least one of the transistor structures.

In seventeenth examples, for any of the sixteenth examples removing or disabling one or more of the channel regions comprises implanting an impurity into at least one of the transistor structures from the back side.

In eighteenth examples, for any of the seventeenth examples the implanting is to depth that includes only one of the channel regions.

In nineteenth examples, for any of the sixteenth examples removing or disabling one or more of the channel regions comprises exposing a first of the channel regions by etching through one or more materials from the back side of at least one of the transistor structures, and removing at least a portion of the first of the channel regions.

In twentieth examples, for any of the nineteenth examples, the method further comprises at least partially backfilling a recess where the first of the channel regions was removed with a dielectric material.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
a first interconnect metallization level;
a second interconnect metallization level;
first and second transistor structures between the first interconnect metallization level and the second interconnect metallization level, wherein:
the first transistor structure comprises:
a first gate electrode adjacent to a first stack of a first number of channel regions and an inactive channel material; and
a first source region coupled to a first drain region through the first number of channel regions, the first source region and the first drain region having a first conductivity type;
the second transistor structure comprises:
a second gate electrode adjacent to a second stack of a second number of channel regions, the second number of channel regions greater than the first number of channel regions; and
a second source region coupled to a second drain region through the second number of channel regions, the second source region and the second drain region having a second conductivity type, complementary to the first conductivity type;
a first spacing between the second interconnect metallization level and a nearest one of the first number of channel regions is greater than a second spacing between the second interconnect metallization level and a nearest one of the second number of channel regions;
the inactive channel material is substantially coplanar with the nearest one of the second number of channel regions and is within the first spacing; and
the inactive channel material is a semiconductor material having the second conductivity type with a second impurity concentration exceeding a first impurity concentration in the first number of channel regions; and
a monocrystalline material between the second interconnect metallization level and the nearest one of the first number of channel regions, wherein the monocrystalline material is also between the second interconnect metallization level and the nearest one of the second number of channel regions.

2. The IC structure of claim 1, wherein the channel regions of the first number of channel regions have a first channel length between the first source region and the first drain region and wherein the semiconductor material also has the first channel length.

3. The IC structure of claim 1, wherein:
first transistor structure is a PMOS transistor structure and the first conductivity type is p-type;
the second transistor structure is an NMOS transistor structure and the second conductivity type is n-type;
the first impurity concentration comprises at least one of P, Ar, or Sb; and
the first impurity concentration is at least 1e19cm−3.

4. The IC structure of claim 1, wherein the monocrystalline material has a third impurity concentration, lower than the second impurity concentration.

5. A computer system, comprising:
a power supply; and
an IC die coupled to the power supply, the IC die comprising the integrated circuit (IC) structure of claim 1.

6. The computer system of claim 5, further comprising a battery coupled to the power supply.

7. An integrated circuit (IC) structure, comprising:
a first interconnect metallization level;
a second interconnect metallization level;
first and second transistor structures between the first interconnect metallization level and the second interconnect metallization level, wherein:
the first transistor structure comprises a first gate electrode adjacent to a first stack of a first number of channel regions;
the second transistor structure comprises a second gate electrode adjacent to a second stack of a second number of channel regions, the second number of channel regions greater than the first number of channel regions; and
a first spacing between the second interconnect metallization level and a nearest one of the first number of channel regions is greater than a second spacing between the second interconnect metallization level and a nearest one of the second number of channel regions;
individual ones of the first number of channel regions are substantially coplanar with corresponding ones of the second number of channel regions; and
a monocrystalline material between the second interconnect metallization level and the nearest one of the second number of channel regions.

8. The IC structure of claim 7, wherein the first spacing comprises an inactive channel material substantially coplanar with the nearest one of the second number of channel regions and is within the first spacing.

9. The IC structure of claim 7, wherein the first interconnect metallization level is over a top of the first and second transistor structures and wherein the second interconnect metallization level is under a bottom of the first and second transistor structures.

10. The IC structure of claim 7, wherein the first number of channel regions is one fewer than the second number of channels regions.

11. An integrated circuit (IC) structure, comprising:
a first interconnect metallization level;
a second interconnect metallization level;
first and second transistor structures between the first interconnect metallization level and the second interconnect metallization level, wherein:
the first transistor structure comprises:
a first gate electrode adjacent to a first stack of a first number of channel regions and an inactive channel material; and
a first source region coupled to a first drain region through the first number of channel regions;
the second transistor structure comprises:
a second gate electrode adjacent to a second stack of a second number of channel regions, the second number of channel regions greater than the first number of channel regions; and
a second source region coupled to a second drain region through the second number of channel regions;
a first spacing between the second interconnect metallization level and a nearest one of the first number of channel regions is greater than a second spacing between the second interconnect metallization level and a nearest one of the second number of channel regions;

the inactive channel material is substantially coplanar with the nearest one of the second number of channel regions and is within the first spacing; and a monocrystalline material between the second interconnect metallization level and the nearest one of the first number of channel regions, wherein the monocrystalline material is also between the second interconnect metallization level and the nearest one of the second number of channel regions.

12. The IC structure of claim 11, wherein:

the first source region and the first drain region have a first conductivity type;

the second source region and the second drain region have a second conductivity type, complementary to the first conductivity type;

the inactive channel material has the second conductivity type with a second impurity concentration exceeding a first impurity concentration in the first number of channel regions.

\* \* \* \* \*